United States Patent
Huang

(10) Patent No.: US 8,120,229 B2
(45) Date of Patent: Feb. 21, 2012

(54) MIDDLE SPRING SUPPORTED MICRO-ELECTRO-MECHANICAL TRANSDUCERS

(75) Inventor: Yongli Huang, San Jose, CA (US)

(73) Assignee: Kolo Technologies, Inc., San Jose, CA (US)

( * ) Notice: Subject to any disclaimer, the term of this patent is extended or adjusted under 35 U.S.C. 154(b) by 240 days.

(21) Appl. No.: 11/914,608

(22) PCT Filed: May 18, 2006

(86) PCT No.: PCT/IB2006/051569
§ 371 (c)(1),
(2), (4) Date: Nov. 16, 2007

(87) PCT Pub. No.: WO2006/123301
PCT Pub. Date: Nov. 23, 2006

(65) Prior Publication Data
US 2008/0197751 A1 Aug. 21, 2008

Related U.S. Application Data

(60) Provisional application No. 60/682,619, filed on May 18, 2005, provisional application No. 60/692,038, filed on Jun. 17, 2005, provisional application No. 60/705,606, filed on Aug. 3, 2005, provisional application No. 60/744,242, filed on Apr. 4, 2006.

(51) Int. Cl.
*H02N 1/00* (2006.01)
*A61B 8/00* (2006.01)
*H04R 19/00* (2006.01)

(52) U.S. Cl. ..... 310/309; 600/459; 367/181; 73/514.32; 381/191

(58) Field of Classification Search ............... 310/309; 381/174, 191; 600/459, 437; 367/163, 181; 73/514.32
See application file for complete search history.

(56) References Cited

U.S. PATENT DOCUMENTS
2,975,307 A 3/1961 Schroeder et al.
4,889,832 A 12/1989 Chatterjee
(Continued)

FOREIGN PATENT DOCUMENTS
EP 1306901 (A2) 5/2003
(Continued)

OTHER PUBLICATIONS

PCT International Search Report and Written Opinion for PCT Application No. PCT/IB06/51567, mailed on Jun. 5, 2008, 7 pgs.

(Continued)

*Primary Examiner* — Karl Tamai
(74) *Attorney, Agent, or Firm* — Lee & Hayes, PLLC

(57) ABSTRACT

A micro-electro-mechanical transducer (such as a cMUT) is disclosed. The transducer has a substrate, a top plate, and a middle spring layer therebetween. The substrate and the middle spring layer define cavities therebetween sidewalled by standing features. The middle spring layer is anchored by the standing features to create cantilevers over the cavities to enable a vertical displacement of connectors placed on the middle spring layer. The connectors define a transducing space between the middle spring layer and the top plate. The top plate is transported by the vertical displacement of the connectors in a piston-like motion to change the transducing space and to effectuate energy transformation. Various configurations of cantilevers, including single cantilevers, back-to-back double cantilevers and head-to-head double cantilevers (bridges) are possible.

62 Claims, 13 Drawing Sheets

U.S. PATENT DOCUMENTS

| | | | |
|---|---|---|---|
| 5,055,731 A * | 10/1991 | Nihei et al. | 310/309 |
| 5,894,452 A | 4/1999 | Ladabaum et al. | |
| 5,993,677 A | 11/1999 | Biasse et al. | |
| 6,002,117 A | 12/1999 | Pak | |
| 6,004,832 A | 12/1999 | Haller et al. | |
| 6,283,601 B1 | 9/2001 | Hagelin et al. | |
| 6,512,625 B2 | 1/2003 | Mei et al. | |
| 6,585,653 B2 | 7/2003 | Miller | |
| 6,600,587 B2 | 7/2003 | Sniegowski et al. | |
| 6,605,518 B1 | 8/2003 | Ohmi et al. | |
| 6,684,469 B2 * | 2/2004 | Horning et al. | 29/25.35 |
| 6,828,656 B2 | 12/2004 | Forbes et al. | |
| 6,865,140 B2 * | 3/2005 | Thomenius et al. | 367/155 |
| 7,052,464 B2 | 5/2006 | Wodnicki | |
| 7,564,172 B1 * | 7/2009 | Huang | 310/328 |
| 2002/0031294 A1 | 3/2002 | Takeda et al. | |
| 2002/0074670 A1 | 6/2002 | Suga | |
| 2003/0022475 A1 | 1/2003 | Vieux-Rochaz et al. | |
| 2003/0207566 A1 | 11/2003 | Forbes et al. | |
| 2003/0222354 A1 | 12/2003 | Mastromatteo et al. | |
| 2004/0027671 A1 | 2/2004 | Wu et al. | |
| 2004/0085858 A1 | 5/2004 | Khuri-Yakub et al. | |
| 2004/0106221 A1 | 6/2004 | Hunter et al. | |
| 2005/0046922 A1 | 3/2005 | Lin et al. | |
| 2005/0075572 A1 | 4/2005 | Mills et al. | |
| 2005/0168849 A1 | 8/2005 | Lin | |
| 2005/0237858 A1 | 10/2005 | Thomenius et al. | |
| 2006/0004289 A1 | 1/2006 | Tian et al. | |
| 2006/0125348 A1 * | 6/2006 | Smith et al. | 310/309 |
| 2008/0194053 A1 * | 8/2008 | Huang | 438/53 |
| 2008/0197751 A1 * | 8/2008 | Huang | 310/311 |
| 2008/0290756 A1 | 11/2008 | Huang | |
| 2009/0140606 A1 * | 6/2009 | Huang | 310/322 |

FOREIGN PATENT DOCUMENTS

WO    WO2004084300 A1    9/2004

OTHER PUBLICATIONS

PCT International Search Report and Written Opinion for PCT Application No. PCT/IB06/51568, mailed on Jun. 16, 2008, 7 pgs.

PCT International Search Report and Written Opinion for PCT Application No. PCT/IB06/51569, mailed on Jun. 18, 2008, 7 pgs.

PCT International Search Report and Written Opinion for PCT Application No. PCT/IB06/51948, mailed on Jul. 7, 2008, 9 pgs.

Chow et al, "Process Compatible Polysilicon-Based Electrical Through-Wafer Interconnects in Silicon Substrates," Journal of Electromechanical Systems, IEEE, vol. 11, No. 6, Dec. 2002, pp. 631-640.

Ergun et al, "Capacitive Micromachined Ultrasonic Transducers: Fabrication Technology," IEEE Transactions on Ultrasonics, Ferroelectrics, and Frequency Control, vol. 52, No. 12, Dec. 2005, pp. 2242-2258.

Huang et al, "Fabricating Capacitive Micromachined Ultrasonic Transducers with Wafer-Bonding Technology," Journal of Microelectromechanical Systems, IEEE, vol. 12, No. 2, Apr. 2003, pp. 128-137.

Jin et al, "Micromachined Capacitive Transducer Arrays for Medical Ultrasound Imaging," 1998 IEEE Ultrasonics Symposium, pp. 1877-1880.

Lemmerhirt et al, "Air-Isolated Through-Wafer Interconnects for Microsystem Applications," The 12th International Conference on Solid State Sensors, Actuators and Microsystems, IEEE, Jun. 6-12, 2003, pp. 1067-1070.

Jin et al, "Recent Progress in Capacitive Micromachined Ultrasonic Immersion Transducer Array," The 8th International Symposium on Integrated Circuits, Devices and Systems, Singapore, Sep. 8-10, 1999, pp. 159-162.

Douglass et al, "Why is the Texas Instruments Digital Micromirror Device(TM) (DMD(TM)) so Reliable?", 1997, 7 pgs.

Hornbeck et al, "Digital Light Processing and MEMS: Timely Convergence for a Bright Future," DLP—Digital Light Processing, 1995, 25 pgs.

Huang et al, "Capacitive Micromachined Ultrasonic Transducers (CMUTS) with Isolation Posts," 2004 IEEE International Ultrasonics, Ferroelectrics, and Frequency Control Joint 50th Anniversary Conference, pp. 2223-2226.

Huang et al, "New Fabrication Process for Capacitive Micromachined Ultrasonic Transducers," IEEE, 2003, pp. 522-525.

Huang et al, "Optimized Membrane Configuration Improves CMUT Performance," 2004 IEEE Ultrasonics Symposium, 2004 IEEE International Ultrasonics, Ferroelectrics, and Frequency Control Joint 50th Anniversary Conference, pp. 505-508.

Hwang et al, "Design and Fabrication of the Thin-Film Micromirror Array-actuated for Large Projection Displays," Journal of the Korean Physical Society, vol. 33, Nov. 1998, pp. S467-8470.

Jeon et al, "Electrostatic Digital Micromirror Using Interdigitated Cantilevers," IEEE, 2002, pp. 528-531.

Khuri-Yakub et al, "Micromachined Ultrasonic Transducers and Their Use for 2D and 3D Imaging," Acoustical Imaging, Kluwer Academic Publishers, Netherlands, 2004, pp. 1-9.

Kim et al, "A High Fill-Factor Micro-Mirror Stacked on a Crossbar Torsion Spring for Electrostatically-Actuated Two-Axis Operation in Large-Scale Optical Switch," IEEE, 2003, pp. 259-262.

Zhou et al, "Two-Axis Scanning Mirror for Free-Space Optical Communication between UAVs," IEEE/LEOS Optical MEMS 2003, Hawaii, US, Aug. 2003, pp. 1-2.

Huang et al, "Capacitive Micromachined Ultrasonic Transducers (CMUTS) with Piston-Shaped Membranes," 2005 IEEE Ultrasonics Symposium, 2005, pp. 589-592.

Extended European Search Report mailed on Feb. 18, 2011 for European Patent Application No. 06744966.0, a counterpart foreign application for U.S. Appl. No. 11/914,584, 16 pgs.

Translated the Chinese Office Action mailed Mar. 23, 2011 for Chinese Patent Application No. 200680017137.1, a counterpart foreign application of U.S. Appl. No. 11/914,597.

Final Office Action for U.S. Appl. No. 11/917,666 mailed Apr. 25, 2011, Yongli Huang, "Micro-Electro-Mechanical Transducer Having an Insulation Extension".

Non-Final Office Action for U.S. Appl. No. 11/914,584 mailed on Apr. 25, 2011, Yongli Huang, "Through-Wafer Interconnection".

* cited by examiner

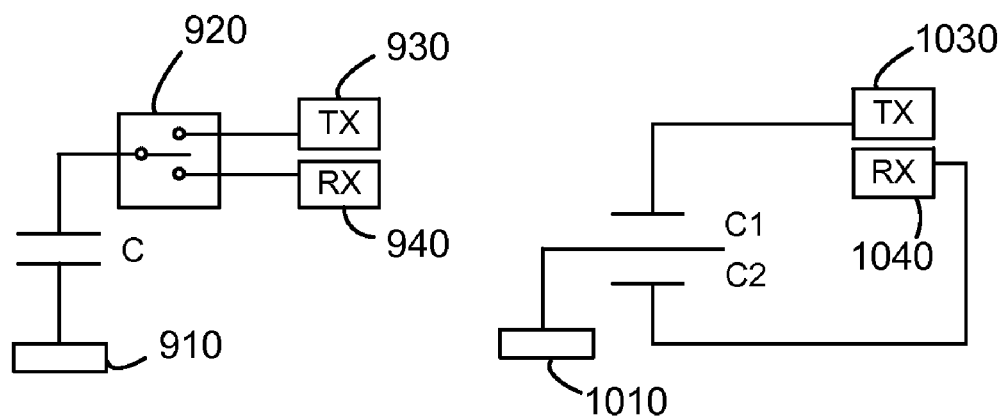
**FIG. 9
(prior art)**
FIG. 10
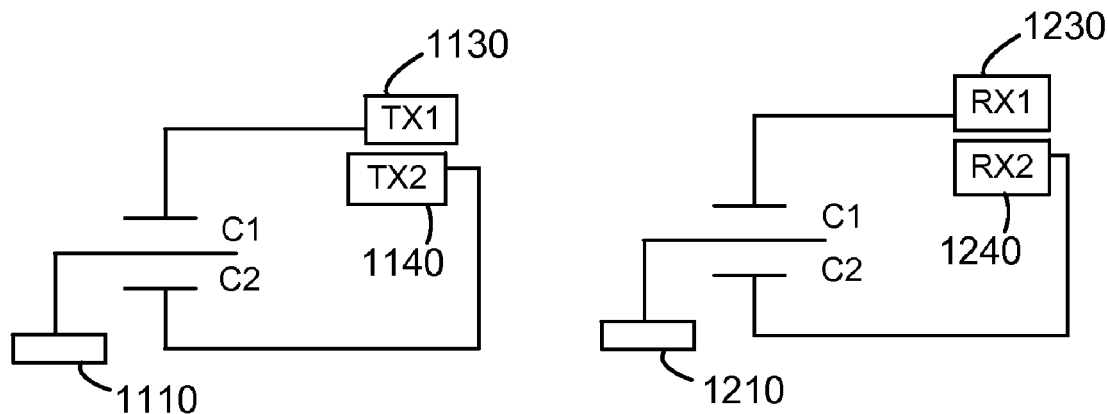
FIG. 11
FIG. 12

MIDDLE SPRING SUPPORTED MICRO-ELECTRO-MECHANICAL TRANSDUCERS

RELATED APPLICATIONS

This application is a national stage application of international patent application PCT/IB2006/051569, claiming priority from U.S. Provisional Application Ser. No. 60/682,619, filed May 18, 2005; Ser. No. 60/692,038, filed Jun. 17, 2005; Ser. No. 60/705,606, filed Aug. 3, 2005; and Ser. No. 60/744,242, filed Apr. 4, 2006, which applications are incorporated herein by reference in their entirety.

This application further incorporates herein by reference in entirety the following:

International Application (PCT) PCT/IB2006/051566, entitled THROUGH-WAFER INTERCONNECTION, filed on May 18, 2006;

International Application (PCT), PCT/IB2006/051567, entitled METHODS FOR FABRICATING MICRO-ELECTRO-MECHANICAL DEVICES, filed on May 18, 2006; and International Application (PCT), PCT/IB2006/051568, entitled MICRO-ELECTRO-MECHANICAL TRANSDUCERS, filed on May 18, 2006.

FIELD OF THE INVENTION

The present invention relates to micro-electro-mechanical devices that have a movable mechanical part for energy transformation, particularly to micromachined ultrasonic transducers (MUT) such as capacitance micromachined ultrasonic transducers (cMUT).

BACKGROUND OF THE INVENTION

Micro-electro-mechanical transducers usually share a common feature which includes a movable mechanical part used for energy transformation. One example of such micro-electro-mechanical transducers is micromachined ultrasonic transducers (MUT). An ultrasound transducer performs a chain of energy transformation to realize its function of a transducer. In its receiving mode, the acoustic energy of ultrasound waves propagating in a medium where the transducer is placed is transformed to mechanical energy of a movable part (conventionally a vibrating membrane) in the transducer. The motion of the movable part is then transformed to a detectable electromagnetic (usually electrical) signal. In its transmitter mode, the reverse chain of energy transformation takes place.

Various types of ultrasonic transducers have been developed for transmitting and receiving ultrasound waves. Ultrasonic transducers can operate in a variety of media including liquids, solids and gas. These transducers are commonly used for medical imaging for diagnostics and therapy, biochemical imaging, non-destructive evaluation of materials, sonar, communication, proximity sensors, gas flow measurements, in-situ process monitoring, acoustic microscopy, underwater sensing and imaging, and many others. In addition to discrete ultrasound transducers, ultrasound transducer arrays containing multiple transducers have been also developed. For example, two-dimensional arrays of ultrasound transducers are developed for imaging applications.

Compared to the widely used piezoelectric (PZT) ultrasound transducer, the MUT has advantages in device fabrication method, bandwidth and operation temperature. For example, making arrays of conventional PZT transducers involves dicing and connecting individual piezoelectric elements. This process is fraught with difficulties and high expenses, not to mention the large input impedance mismatch problem presented by such elements to transmit/receiving electronics. In comparison, the micromachining techniques used in fabricating MUTs are much more capable in making such arrays. In terms of performance, the MUT demonstrates a dynamic performance comparable to that of PZT transducers. For these reasons, the MUT is becoming an attractive alternative to the piezoelectric (PZT) ultrasound transducers.

Among the several types of MUTs, the capacitive micromachined ultrasonic transducer (cMUT), which uses electrostatic transducers, is widely used. Other MUTs using piezoelectric (pMUT) and magnetic (mMUT) transducers are also adopted. Examples of prior art cMUT structure are shown in FIGS. 1A-1C, FIGS. 2-3, and FIGS. 4A-4B.

FIG. 1A shows a cross-sectional view of a basic structure of a prior art cMUT having multiple cells. FIG. 1B shows an enlarged view of a single cMUT cell 10. FIG. 1C shows a corresponding schematic top view of the same prior art multi-cell cMUT structure. In practice, a functional cMUT may have at least one independently addressable cMUT element. Based on the conventional design, each cMUT element consists of many cMUT cells which are connected in parallel. Four cells are shown in FIG. 1A, a single cell is shown in FIG. 1B, and ten cells are shown in FIG. 1C, but all cells belong to a single cMUT element in FIGS. 1A-1C.

The cMUT of FIGS. 1A-1C is built on a substrate 11. As shown in a selected cMUT cell 10, each cMUT cell has a parallel plate capacitor consisting of a rigid bottom electrode 12 and a top electrode 14 residing on or within a flexible membrane 16 that is used to transmit or receive an acoustic wave in the adjacent medium. The flexible membrane 16 in each cell is supported by the insulation wall or posts 18. The membrane 16 is spaced from the substrate 11 and the top electrode 12 to define a transducing space 19 therebetween. A DC bias voltage is applied between the electrodes 12 and 14 to deflect the membrane 16 to an optimal position for cMUT operation, usually with the goal of maximizing sensitivity and bandwidth. During transmission an AC signal is applied to the transducer. The alternating electrostatic force between the top electrode and the bottom electrode actuates the membrane 16 in order to deliver acoustic energy into the medium (not shown) surrounding the cMUT. During reception the impinging acoustic wave vibrates the membrane 16, thus altering the capacitance between the two electrodes. An electronic circuit detects this capacitance change.

Alternatively the membrane can be actuated and the displacement of the membranes detected using a piezoelectric transducer (pMUT) and a magnetic transducer (mMUT). FIG. 2 shows a pMUT cell 20 which has a similar structure to the cMUT cell 10 except that the capacitor (electrodes 12 and 14) are replaced by a piezoelectric member 24 on the membrane 26. FIG. 3 shows a mMUT cell 30 which has a similar structure to the cMUT cell 10 except that the capacitor (electrodes 12 and 14) are replaced by a magnetic layer 34 on the membrane 36.

Methods of fabrication for making a cMUT shown in FIGS. 1A-1C have been developed. Exemplary methods are disclosed in U.S. Pat. Nos. 6,632,178 and 6,958,255.

There are drawbacks in the cMUTs of the prior art structures and methods. Many of these drawbacks relate to the fact that each addressable cMUT element is made of many individual cells and each cell has its cMUT membrane clamped or fixed on edges shared by the adjacent cells. Examples of the drawbacks are listed below.

(1) The average displacement of the membranes is small because of the clamped edges. As a result both the device transmission and reception performance are poor.

(2) Surface areas occupied by the clamped areas (e.g., edges) and the walls or posts are non-active, thus reducing the device fill factor and the overall efficiency.

(3) Anchor areas introduce a parasitic capacitance which decreases the device sensitivity.

(4) The anchor pattern within the surface of the cMUT element may cause ultrasonic wave interference which limits the device bandwidth.

(5) The non-uniform displacement of the membrane may disturb the ultrasonic wave pattern. For example, the non-uniform displacement may affect the ultrasonic beam pattern emitted from the transducer surface and also cause acoustic cross coupling through the transducer surface.

(6) The resonant frequencies of individual cells in the same cMUT element may be different between each other because of the process variation. This causes phase differences of the membrane motion among different cells in the same cMUT element during operation. As a result, the sum of the average displacement of the cMUT element may degrade dramatically. This problem degrades the device performance especially when the cMUT works in a high quality factor (Q-factor) condition, for example in air.

(7) The acoustic energy can couple into the transducer substrate through supporting walls and cause undesired effects such as acoustic cross coupling between the cMUT elements. An effort to reduce the cross-coupling through the substrate by introducing materials with desired acoustic properties may require occupation of extra space between elements.

The above problems also exist in the pMUT and mMUT of the prior art since they have a similar structure as the cMUT as shown in FIG. 1.

Another cMUT device having a compliant support structure built on the substrate to support the membrane is disclosed in the U.S. Pat. No. 7,030,536. A cMUT according to that design is shown in FIGS. 4A-4B. FIG. 4A shows cross-sectional view of a single cMUT cell 40 as disclosed in that patent. FIG. 4B shows the schematic top view of multiple cMUT cells as disclosed in that patent. Compared to the conventional cMUT structure shown in FIGS. 1A-1C, the cMUT structure disclosed in U.S. Pat. No. 7,030,536 uses a compliant support structure 48 in place of the conventional insulation wall 18 to define the perimeter ends of the membrane 46 of each cMUT cell 40, such that the top electrode 44 and the membrane 46 may move in a piston-like manner. This has potential advantages but the design according to the patent also introduces its own problems, as will be discussed in view of the present invention in the detailed description.

Due to the importance of these MUT devices, it is desirable to improve the technology in terms of performance, functionality, and manufacturability.

SUMMARY OF THE INVENTION

This application discloses a micro-electro-mechanical transducer (such as a cMUT) that has a movable mechanical part to transform energy. The transducer has a substrate, a top plate, and a middle spring layer therebetween. The substrate has cavities sidewalled by standing features. The middle spring layer is anchored by the standing features to create cantilevers over the cavities to enable a vertical displacement of connectors placed on the middle spring layer. The connectors define a transducing space between the middle spring layer and the top plate. The top plate is transported by the vertical displacement of the connectors in a piston-like motion to change the transducing space and to effectuate energy transformation. Various configurations of cantilevers, including single cantilevers, back-to-back double cantilevers and head-to-head double cantilevers (bridges) are possible.

According to one aspect of the invention, a micro-electro-mechanical transducer comprises a back-to-back double cantilever structure. The transducer has:

(a) a substrate;

(b) a middle spring layer placed over the substrate, wherein the substrate and the middle spring layer define a first cavity and a second cavity therebetween, the first cavity and the second cavity share a standing feature including a first sidewall bordering the first cavity and an opposing second sidewall bordering the second cavity, and wherein the middle spring layer has a first portion connected to the first sidewall and covering at least a part of the first cavity, and a second portion connected to the second sidewall and covering at least a part of the second cavity;

(c) a first connector having a connector height on the first portion of the middle spring layer, the first connector being horizontally distanced from the first sidewall by a sufficient length such that the first portion of the middle spring layer between the first connector and the first sidewall defines a first cantilever anchored at the first sidewall;

(d) a second connector having substantially the same connector height on the second portion of the middle spring layer, the second connector being horizontally distanced from the second sidewall by a sufficient length such that the second portion of the middle spring layer between the second connector and the second sidewall defines a second cantilever anchored at the second sidewall; and (e) a top plate placed over the first connector and the second connector, the connectors separating the top plate from the middle spring layer to define a transducing space below the top plate.

The first cantilever and the first cavity enable a vertical displacement of the first connector, and the second cantilever and the second cavity enable a vertical displacement of the second connector, the vertical displacements of the connectors transporting the top plate substantially vertically, thus changing the transducing space and activating a transducing member in the transducer for energy transformation.

In one embodiment, the first cavity and the second cavity are connected to each other. For example, the first cavity and the second cavity may be different portions of a circular cavity. Furthermore, the first connector and the second connector may also be different portions of a circular connector.

The substrate may be a conductive wafer, such as a silicon wafer. The top plate may also include a conductive layer, such as a silicon layer. This may be a benefit of using silicon-based fabrication process.

When the top plate has a conductive layer near its bottom, an insulation layer may be disposed between the connector and the top plate for insulation purpose. Alternatively, the vertical displacement of the connector may be limited to a maximum displacement less than a maximum vertical distance the top plate can be transported through the transducing space. One way to accomplish this is to limit the maximum vertical displacement of the connector by a motion stopper disposed in the cavity. Another way is to limit the depth of the cavities underneath the middle spring layer.

One example of the micro-electro-mechanical transducer of the present invention is a capacitance micromachined ultrasonic transducer, wherein the transducing member comprises a top electrode and the bottom electrode. The top electrode comprises a conductive layer deposited on a surface of the top plate. If the standing feature of the substrate is conductive, the bottom electrode may include at least a part of the standing feature of the substrate. But the bottom electrode may also be a separate conductive layer deposited on the middle spring layer.

Other examples the micro-electro-mechanical transducer of the present invention include a pMUT, in which the transducing member comprises a piezoelectric member disposed on the top plate, and a mMUT, in which the transducing member comprises a magnetic member disposed on the top plate.

Both the middle spring layer and the top plate may have many configurations. For example, the middle spring layer may be a contiguous layer placed over the standing feature of the substrate and extending over the sidewall to cover at least part of the cavity. The middle spring layer may include a first region and a second region, wherein the first region may have a low doped or intrinsic silicon material, and the second region a highly doped silicon material with increased conductivity. The two regions may form a PN junction to enhance high voltage protection. The top plate may have a thickness profile having at least two different thicknesses. The top plate may also include two different materials. For example, the first material may be a plurality of segments divided by separation trenches and the second material may connect the segments of the first material by spanning over the separation trenches. The second material may fill or partially fill the trenches.

In particular, the top plate may be a micromachined structure to have internal structures such as holes formed therein. The holes may have a size and location profile optimized for a desired rigidity/mass ratio of the top plate.

Preferably, the top plate is significantly more rigid than the middle spring layer and is substantially unbent when transported by the vertical displacement of the connectors.

The transducer structure may be integrated with integrated circuits. For example, the integrated circuits may be formed in the top plate.

The layered structure of the transducer in accordance with the present invention may be stacked with another transducer which may be of a design according to the present invention or any other conventional transducer. For example, the transducer of the present invention may be a cMUT transducer wherein the transducing member includes a first capacitor, and the cMUT transducer further comprises a second transducing member including a second capacitor stacked on top of the first capacitor. The two capacitors may be configured to operate in a different mode (transmission or receiver), or they may be configured to operate in the same mode.

In another aspect of the invention, a micro-electro-mechanical transducer comprises a head-to-head double cantilever (bridge) structure. The transducer has:

(a) a substrate;

(b) a middle spring layer placed over the substrate, wherein the substrate and the middle spring layer defining a cavity therebetween, the cavity is bordered by a first standing feature and a second standing feature, and the first standing feature has a first sidewall bordering the cavity and the second standing feature having a second sidewall bordering the cavity on an opposing side, and wherein the middle spring layer extends from the first sidewall to the second sidewall to cover the cavity;

(c) a connector having a connector height on the middle spring layer, the connector being horizontally distanced from both the first sidewall and the second sidewall such that the middle spring layer between the first sidewall and the second sidewall defines a double-cantilever anchored at the first sidewall and the second sidewall and connected to each other head-to-head; and (d) a top plate placed over the connector, which separates the top plate from the middle spring layer to define a transducing space below the top plate.

The double-cantilever and the cavity enable a vertical displacement of the connector, which transports the top plate substantially vertically, thus changing the transducing space and activating a transducing member in the transducer for energy transformation. Many embodiments similar to that with the back-to-back double cantilever configuration are possible with the head-to-head double cantilever (bridge) configuration.

A transducer may also comprise basic building units in single cantilevers which is a half of either the back-to-back double cantilever or head-to-head double cantilever. Although this may not be the most efficient structure in terms of fabrication process, with novel fabrication methods disclosed in the several other patent applications identified herein filed by the common applicant on even date it is feasible to make such a transducer.

The foregoing and other features and advantages will become more apparent from the following detailed description of several embodiments, which proceeds with reference to the accompanying figures.

BRIEF DESCRIPTION OF THE DRAWINGS

FIG. 9 shows a common prior art connection scheme in which a single capacitor is used for both transmission and reception (detection).

FIG. 10 shows a first exemplary capacitor connection scheme in which two stacked capacitors are used for transmission and reception separately.

FIG. 11 shows a second exemplary connection scheme in which both capacitors are dedicated to transmission.

FIG. 12 shows a third exemplary connection scheme in which both capacitors are dedicated to reception.

DETAILED DESCRIPTION

Figure 1A:
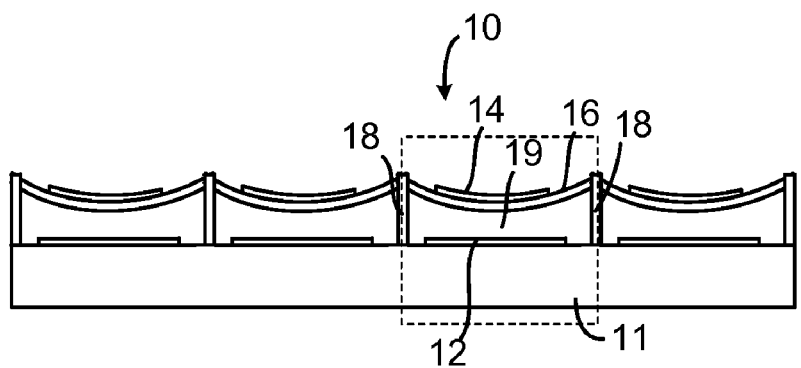
FIG. 1A shows a cross-sectional view of a basic structure of a prior art cMUT having multiple cells.

The micro-electro-mechanical transducer such as a capacitance micromachined ultrasonic transducer (cMUT) of the present invention will be described in detail along with the figures, in which like parts are denoted with like reference numerals or letters. The micro-electro-mechanical transducer may be fabricated using any suitable methods, particularly using the methods disclosed in several other patent applications identified herein, which are filed by a common applicant on even date.

The invention has been described below with reference to specific embodiments. In most cases, a cMUT structure is used to illustrate the invention. It is appreciated, however, that the present invention is not limited to cMUTs. It will be apparent to those skilled in the art that various modifications may be made and other embodiments can be used without departing from the broader scope of the inventions. Therefore, these and other variations upon the specific embodiments are intended to be covered by the present inventions. Those skilled in the art will recognize that various features disclosed in connection with the embodiments may be used either individually or jointly.

It is noted that the terms "transducer" and "transducing member" are used in a broad sense in the present description to not only include devices that perform both actuation and sensing functions but also include devices that perform either an actuation function or an sensing function. It is also noted that the term "cantilever" is used in this description in a broad sense to describe a structure that has an anchored end, a resilient portion extending from the anchored, and to an exerting end to activate or move the resilient portion. A cantilever thus does not necessarily suggest a literal one-dimensional bema-like cantilever, but also includes similar structures have multibeams extending in different directions such as a bridge, or a crossbar, and most definitely also includes area or plane springs (two-dimensional "cantilevers") in which the anchored end is an extended line which may be a closed perimeter of an area or a portion thereof, the resilient portion is an extended area, and the exerting end may be a single point, a small area, or an extended line (close ended, open-ended, or segmented). In addition, the words "circular" and "annular" only suggest in the broadest sense that a shape has a looped form, a curved shape that is nearly looped, or an arrangement that is generally shaped like a ring, and do not suggest a rounded shape or any other shape in particular, nor does it suggest that the loop or ring is entirely complete or unbroken.

In order to illustrate the present invention, certain aspects of the designs according to the prior art are first discussed in light of the present invention. It is noted that the discussion herein casts a hindsight on the prior art designs in light of the present invention for the purpose of clearer illustration.

Figure 4A:
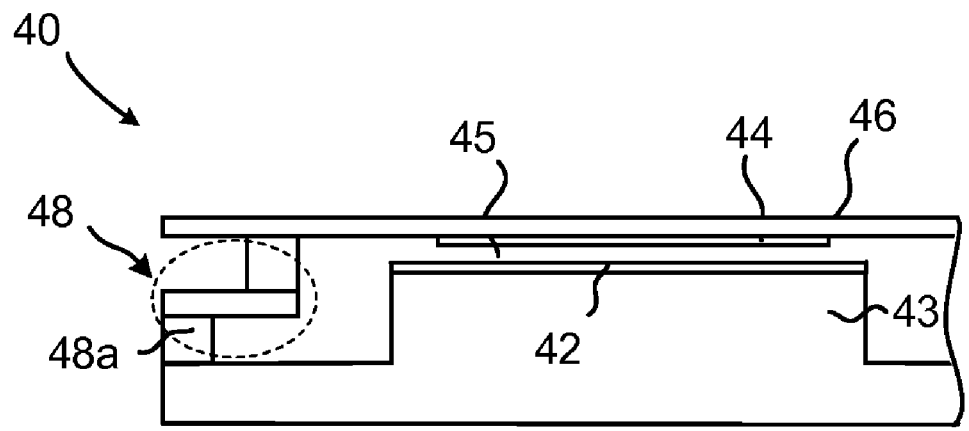
FIG. 4A shows cross-sectional view of another broiled single cMUT cell.
Figure 4B:
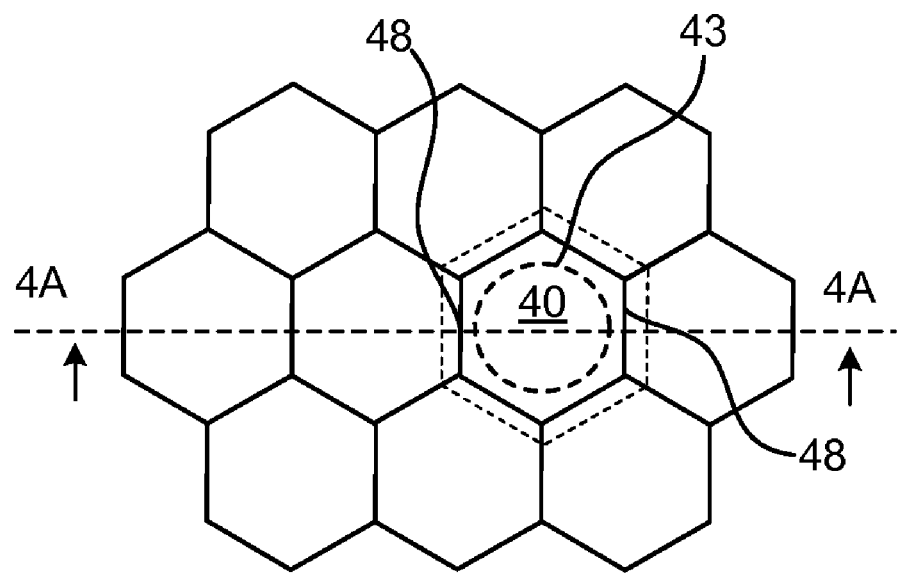
FIG. 4B shows a corresponding schematic top view of multiple cMUT cells of FIG. 4A.

Referring to FIGS. 4A and 4B, a prior art cMUT design is shown to use a compliant support structure 48 in place of the conventional insulation wall 18 to define the perimeter ends of the membrane 46 for each cMUT cell 40, such that the top electrode 44 and the membrane 46 may move in a piston-like manner through the space 45 between the bottom electrode 42 and the top electrode 44. The top electrode 44 is attached to bottom of the membrane 46. The bottom electrode 42 sits on top of a pedestal 43. In each cMUT cell, the membrane 46 is fixed to the compliant support structure 48 which is essentially a sealed sidewall to constitute the perimeter 48 (FIG. 4B) of each cMUT cell 40 the same way as the fixed membrane-based cMUT design showing in FIGS. 1A-1C. This is better seen in the context of the multi-cell structure shown in FIG. 4B.

The above design has potential advantages but also introduces its own problems. First, it should be noted that the concept of the prior art cMUT design shown in FIGS. 4A-4B is to replace the conventional rigid cell sidewall 18 using a compliant cell sidewall 48 made of compliant support structures. Because a relatively complex compliant cell sidewall 48 takes the place of the simple and narrow insulation wall 18 in FIG. 1, there would be a heightened challenge to minimize the impact of the inactive areas occupied by these peripheral compliant cell sidewalls 48 according to that design. It has been suggested that supplemental electrodes be made on the compliant support structures in the compliant cell sidewall 48 to reduce the inactive areas occupied by the compliant support structures. There is however no indication that such a design would solve the problem, and further no indication whether the design is practical from a fabrication point of view.

Figure 1B:
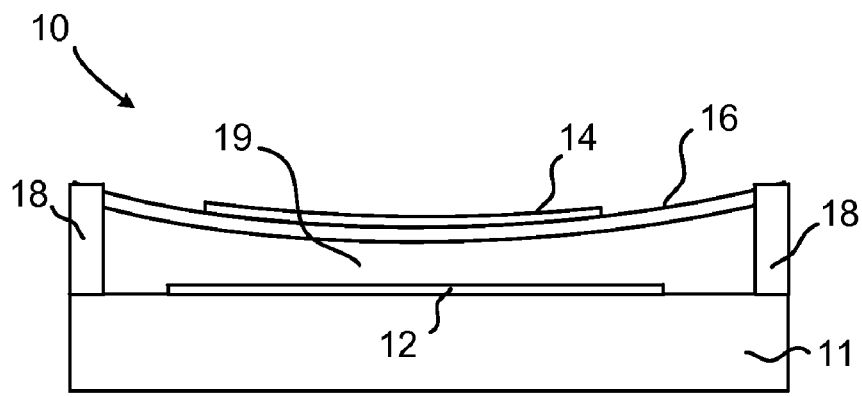
FIG. 1B shows an enlarged view of a single cMUT cell of FIG. 1A.
Figure 1C:
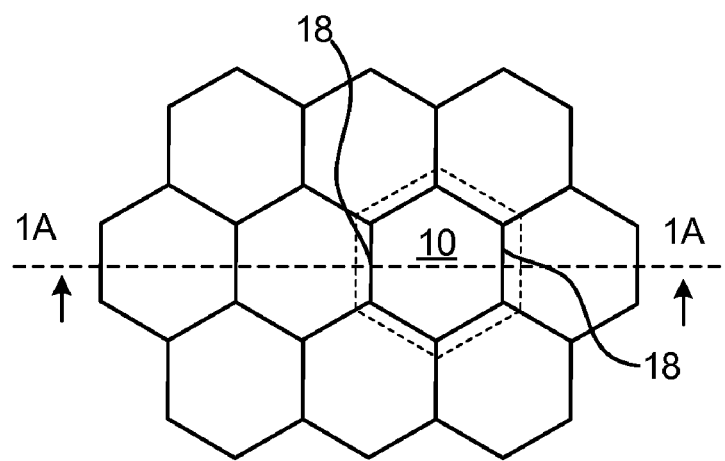
FIG. 1C shows a corresponding schematic top view of the same prior art multi-cell cMUT structure.
Figure 2:
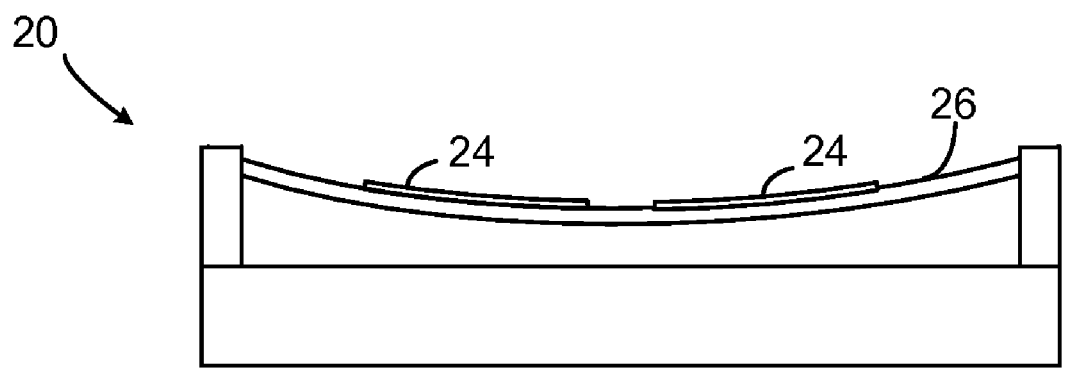
FIG. 2 shows a prior art pMUT cell.
Figure 3:
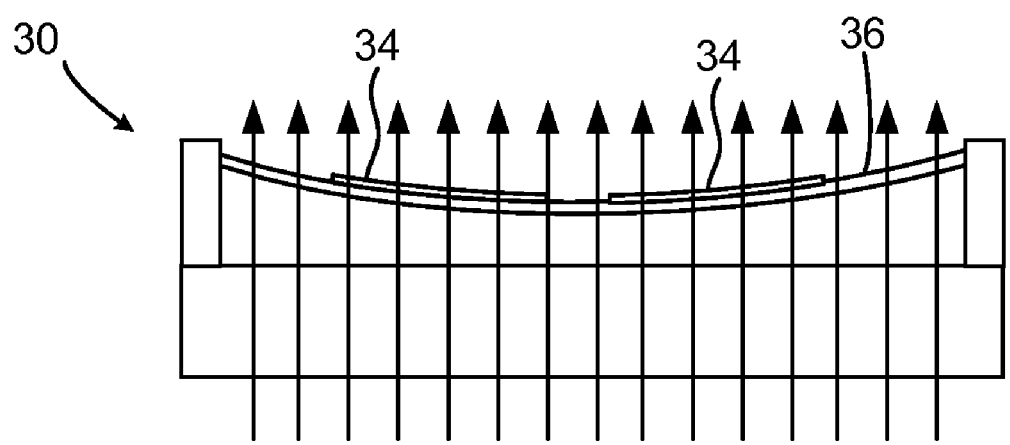
FIG. 3 shows a prior art mMUT cell.

Second, the compliant cell sidewall 48 defines the boundary in the overall cMUT structure, as shown in FIG. 4B. The vast majority area of the cMUT cell 40 is therefore occupied by a rigid and nonmovable pedestal 43, which is surrounded by (but separated from) the peripheral compliant cell sidewall 48. The compliant cell sidewall 48 on the edge is the sole structure to support the entire membrane 46 in the cell 40. This retains the same cell limitation that exists in the design of the cMUT showing in FIGS. 1A-1C. For example, it limits the overall size of each single cMUT cell 40. A large cMUT cell would require a large membrane 46, which would have to be very rigid and thick in order to maintain the required resonant frequency. This is one of the most important limitations of the conventional cMUT structure, because of which each addressable cMUT element must be made of multi-cells. For example, in a cMUT structure used in medical phase array, the cMUT element size is the half wavelength of the acoustic wave (e.g., 75 um for a 10 MHz device, 150 um for a 5 MHz device and 750 um for a 1 MHz device). In order to achieve the required device operation frequency, the size of the conventional cMUT cells must be made much smaller than the element or device size without having to use an unreasonably thick membrane. Due to its inherent design concept, the cMUT shown in FIGS. 4A and 4B is likely to behave quite similar to the other cMUT structures in this respect and therefore does not promise solve the related problems. In fact, it was envisioned that multiple small cells similar to what is found in the cMUT structures shown in FIGS. 1A-1C are used for the cMUT structures in FIGS. 4A and 4B.

The present invention is envisioned to do away with the cMUT cell requirement. As will be shown next, although the present invention may still be used to fabricate cMUT elements each having multiple cells, it does not have to be. In fact, due to the inherent characteristics of the cMUT design in accordance with the present invention, it may be preferable from a fabrication point of view to make each addressable cMUT element without any internal cell boundaries. In addition, even when an addressable cMUT element in accordance with the present invention is made of multiple smaller segments (such as areas each having its own top plate layer segment separated from that of others), these smaller segments do not need to have a clamped perimeter or a peripheral support wall, and further do not need to be identical to each other in size or shape.

Figure 5A:
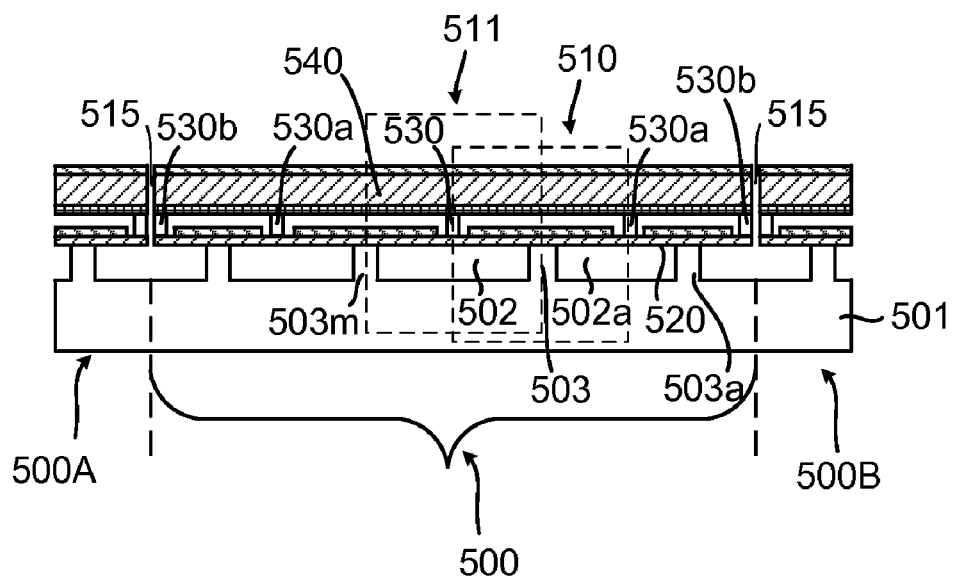
FIG. 5A shows a cross-section view of a cMUT structure showing a complete cMUT element and parts of neighboring cMUT elements.

FIG. 5A is a cross-section view of a cMUT structure showing a complete cMUT element 500 and parts of neighboring cMUT elements 500A and 500B, one on each side. The cMUT structure is built on a substrate wafer 501 and also has a middle spring layer 520 and a top plate 540. The substrate wafer 501, the middle spring layer 520 and the top plate layer 540 are arranged from bottom to top in that order such that the bottom side of the top plate layer 540 faces the top side of the middle spring layer 520, and the bottom side of the middle spring layer 520 faces the front side of the substrate wafer 501. The cMUT elements 500, 500A and 500B are separated by separation trenches 515 formed through the top plate 540 and the middle spring layer 520.

In this description, a cMUT element or a micro-electromechanical element refers to a device unit that is capable of performing an energy transformation through the control of an external or built-in control circuit and is individually addressable through the external or built-in control circuit. Each addressable cMUT element defines a device element area of the substrate wafer and a corresponding device element area of the top plate layer. Because the three layers (the substrate wafer 501, the middle spring layer 520 and the top plate layer 540) are arranged substantially parallel to each other and stacked directly on top of each other, the device element area of the substrate wafer and the corresponding device element area of the top plate layer overlie each other vertically and coincide with each other longitudinally (over the surface dimension of the layers).

In one aspect of the present invention, a resilient structure (such as the middle spring layer 520 in the example shown in FIG. 5A) having multiple connectors distributed over the device element area is provided to vertically transport the top player with distributed support not limited to edges (peripheral areas). In the exemplary structure shown in FIG. 5A, for example, the top plate 540 is connected to the middle spring layer 520 through multiple plate-spring connectors 530, 530a and 530b. Although connectors 530b are located near the device element peripheral defined by separation trenches 515, other connectors 530 and 530a are substantially away from the device element peripheral toward the center of the device element area to provide a more flexible, more efficient, and more distributed support to the top plate layer 540. This distributed support may help build a cMUT element to achieve desired frequency response and mode shapes.

Figure 5B:
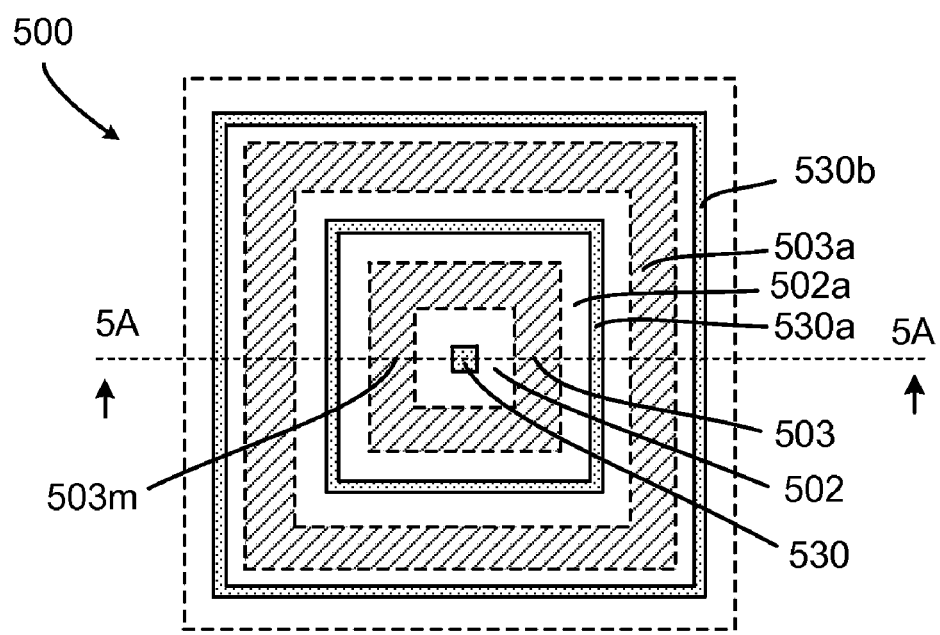
FIG. 5B shows a schematic top view of the cMUT element in FIG. 5A without showing the top plate.
Figure 5C:
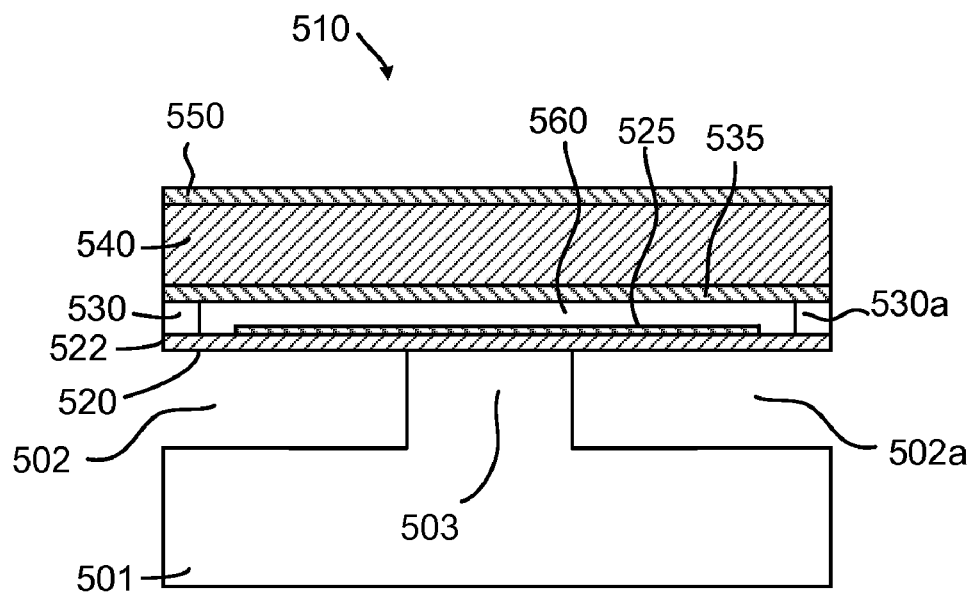
FIG. 5C shows an enlarged view of a selected cMUT portion, which is a part of the complete cMUT element in FIG. 5A.
Figure 5D:
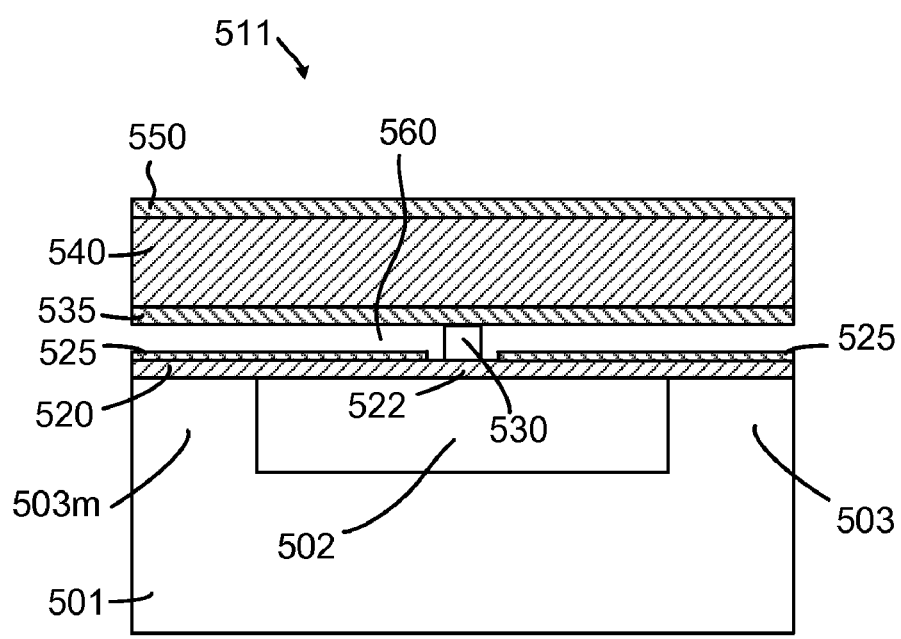
FIG. 5D shows an enlarged view of a different selected cMUT portion, which is another part of the complete cMUT element in FIG. 5A.

For a cMUT that has a very high operating frequency CMUT, however, a basic unit shown in FIGS. 5C-5D may be used as a full CMUT device or element.

FIG. 5B is a schematic top view of the cMUT element 500 without showing the top plate 540. In cross-sectional view of the cMUT element 500 taken along dashed line indicated in FIG. 5B is shown in FIG. 5A. In this exemplary configuration, the cMUT element 500 is generally patterned with concentric squares. In the center is a simple discrete connector 530 positioned on top of the cavity 502 of a simple shape (as shown in the cross-sectional view in FIG. 5A the connector 530 is placed on the middle layer 520 which covers the cavity 502), which is surrounded by a circular sidewall anchor 503, which in turn is surrounded by a circular cavity 502a. Another larger circular connector 530a is positioned on top of the circular cavity 502a, which is surrounded by a circular sidewall anchor 503a of the next level. However, the particular configuration shown in FIG. 5B is only for purpose of illustration. As shown in the several related patent applications identified herein filed by the common applicant on even date, an unlimited number of configurations are possible with the present invention.

FIG. 5C is an enlarged view of a selected cMUT portion 510, which is a part of the complete cMUT element 500. The selected cMUT portion 510 is a basic unit of the complete cMUT element 500 (and other cMUT elements 500A and 500B). The structure of the selected cMUT portion 510 provides a basis to understand the complete cMUT element 500.

As shown in FIG. 5C, the selected cMUT portion 510 includes two halves centered on an imaginary vertical line (not shown) going through the structure from the top to the bottom. As mentioned, for certain application such as a CMUT with a high operation frequency, a full CMUT element or device may use only one basic unit like cMUT portion 510. For other applications, it may be preferred to use a combination of multiple basic units is shown in FIG. 5C and FIG. 5D.

The cMUT portion 510 is built on a substrate 501, on top of which there is a standing feature (referred to as "sidewall anchor" hereinafter) 503 having two sidewalls on two opposing sides bordering cavities 502 and 502a, respectively. The standing feature (sidewall anchor) 503 may be an integrated part of the substrate 501 formed as a result of forming the cavities 502 and 502a, but may also be an additional structure added onto a separate substrate. In one embodiment, for example, the sidewall anchor 503 is part of the middle spring layer 520. The substrate of 501 may be made of either a nonconductive material or a conductive material such as silicon or polysilicon. In a configuration where the sidewall anchor 503 is a separate structure, conductivity of the sidewall anchor 503 may be the same as or different from that of the substrate 501. For example, the substrate 501 may be made of a nonconductive material while the sidewall anchor 503 a conductive material such as metal, silicon or polysilicon.

The cMUT structure shown also has the second cavity 502a along the other side of sidewall anchor 503. Depending on how and where the cMUT portion 510 is taken from the cMUT element 500, the second cavity 502a may either belong to a different and separate cavity, or just another portion of a same circular or extended cavity as the cavity 502. The selected cMUT portion 510 also has a second connector 530a in the other half. Again, depending on how and where the cMUT portion 510 is taken from the cMUT element 500, the second connector 530a may either be a part of a different and separate connector, or just another portion of a same circular or extended connector as the connector 530.

The cMUT structure portion 510 further has these components: a middle spring layer 520 which is preferably an elastic membrane, a bottom electrode 525 placed on the middle spring layer 520, connectors 530 and 530a which stand on top of the middle spring layer 520, an insulation layer 535 sitting over the connector 530, a top plate 540 connected to the connectors 530 and 530a through an intervening insulation layer 535, and a top electrode 550.

The bottom side of the top plate 540 faces the top side of the middle spring layer 520, and the bottom side of the middle spring layer 520 faces the front side of the substrate wafer, whereby the connector 530 stands out from the middle spring layer 520 to define a transducing space 560 below the top plate 540. The transducing space 560 is generally defined between the top plate layer 540 and the top surface of the middle spring layer 520 or the top surface of the sidewall anchor 503, whichever is higher. Where there is an intervening layer between the top plate layer 540 and the top surface of the middle spring layer 520 or the top surface of the sidewall anchor 503, the available transducing space may be reduced. For example, if another layer is deposited over the middle spring layer 520 or the sidewall anchor 503, the top surface of the sidewall anchor is defined as the uncovered surface of the layer deposited over the sidewall anchor 503. In the exemplary configuration shown in FIG. 5C, the actual height of the available transducing space 560 may be reduced by the thicknesses of the insulation layer 535, the bottom electrode 525 and the middle spring layer 520. It should be noted that in some embodiments it is possible to have the entire height between the top plate layer 540 and the top surface of the sidewall anchor 503 available for the transducing space 560. For example, the insulation layer may be removed if other features (e.g. motion stopper) are used to prevent from electric shorting between two electrodes); a conductive substrate wafer may itself be used to effectuate a bottom electrode on the substrate (e.g., on the sidewall anchor 503) without requiring a separate electrode layer; and cantilevers may be made with segments of middle spring layers connected to the sidewall anchor 503 at sides flush with or lower than the top surface of the sidewall anchor 503, instead of using a continuous middle spring layer placed on top of the sidewall anchor 503.

In some embodiments, both substrate 501 including the sidewall anchor 503 and the middle spring layer 520 are conductive. In this case, the substrate 501 may serve as a conductor to access the conductive middle spring layer 520, while the middle spring layer 520 may serve as the bottom electrode.

The connectors 530 and 530a stand on the middle spring layer 520 and each have substantially the same connector height. The connectors 530 and 530a are each horizontally distanced from the respective sidewall of the sidewall anchor 503 by a sufficient length. This defines two cantilevers each anchored at the respective side of sidewall anchor 503 with a back-to-back double cantilever formation. The cantilevers are activated through the respective connector (530 or 530a) at an exerting end (e.g., 522 on the left side cantilever) where the connector (530 or 530a) located. The cantilevers and the respective cavities 502 and 502a enable a vertical displacement of the connectors 530 and 530a, which transport the top plate 540 substantially vertically with a piston-like motion, thus changing the transducing space 560. When the both halves of the cMUT structure 510 move in the same phase, the vertical piston-like motion is further assured.

In this particular example shown, top surface of the sidewall anchor 503 is covered by the middle spring layer 520, which in turn is covered by the bottom electrode 525. Furthermore, the top plate 540 and the connector 530 do not connect with each other directly but are intervened by the insulation layer 535 therebetween. The transducing space 560 is therefore partially occupied by the middle spring layer 520, the bottom electrode 525 and the insulation layer 535. It is noted that the part of the middle spring layer 520 covering the top surface of the sidewall anchor 503, the bottom electrode 525 and the insulation layer 535 are optional. In any event, in order to achieve the intended energy transformation, the transducing space 560 should not be entirely occupied by these extra layers if they are included in the structure.

FIG. 5D is an enlarged view of a different selected cMUT portion 511, which is another part of the complete cMUT element 500. Compared to the selected cMUT portion 510 shown in FIG. 5C, the selected cMUT portion 511 is taken from a shifted location. The selected cMUT portion 511 is built on a substrate 501, which has a cavity 502 bordered by two sidewall anchors 503 and 503a on two opposite sides. The cMUT structure portion 511 further has these components: middle spring layer 520, bottom electrode 525 placed on middle spring layer 520, connector 530 which stands on top of the middle spring layer 520, insulation layer 535 sitting over the connector 530, top plate 540 connected to the connector 530 through an intervening insulation layer 535, and top electrode 550.

The connector 530 (which is also shown in FIG. 5C) stands on the middle spring layer, and is horizontally distanced from the sidewalls of both the sidewall anchor 503 and the sidewall anchor 503a. The middle spring layer 520 between the sidewall anchor 503 and the sidewall anchor 503a defines a double-cantilever anchored at the sidewall anchor 503 and the sidewall anchor 503a. The double-cantilever is connected head-to-head at location 522 where the connector 530 is positioned to form a bridge.

The top plate 540 is placed over the connector 530, which separates the top plate 540 from the middle spring layer 520 to define a transducing space 560 below the top plate. The double-cantilever and the cavity 502 enable a vertical displacement of the connector 530, which transports the top plate 540 substantially vertically, thus changing the transducing space and activating a transducing member in the transducer for energy transformation.

The above designs can be used as a basic building unit for constructing a variety of micro-electro-mechanical transducers that have a movable mechanical part to transform energy. In particular, the basic concept has been effectively used in a novel cMUT structure described in one of the several patent applications identified hearing followed by the common applicant of even date. The novel cMUT structure essentially did away with the conventional concept of the cell insulation wall which divides a cMUT element into cells and is required to support and clamp the membrane at the perimeter of each cMUT cell.

The conventional cMUT designs shown in FIG. 1, including the cMUT design as disclosed in the U.S. Pat. No. 7,030,536, all require a cell insulation wall (e.g., cell insulation wall 18 in FIGS. 1A-1C, or the compliant cell insulation wall 48 in FIGS. 4A-4B) at the perimeter of each cMUT cell to support and clamp the perimeter of the membrane. The cell insulation wall defines the prior art cMUT cells. Within the perimeter defined by the insulation wall, the bottom electrode in the prior art cMUT structure is either directly deposited on the substrate 11 (FIG. 1) or deposited on the top of a pedestal 43 (FIG. 4A), which is separated from the cell insulation wall. Because the majority of the membrane (16 in FIG. 1 or 46 in FIG. 4A) is unsupported, the size of each cell and the selection of the materials for the membrane is limited.

In contrast, with the cMUT design as shown in FIGS. 5A-5D, the cMUT element is no longer required to be divided into cells and thus has no need of an insulation wall to define cell perimeters. The top plate layer 540 and the top electrode 550 are supported by a resilient structure (multiple cantilevers in the embodiment shown) through multiple connectors that can be freely positioned and distributed based on need, thus effectively distributing the entire load of the top plate layer 540 over multiple springs (cantilevers). This solves the problem of the cell limitation inherent to the prior art designs. The middle spring layer 520 and a bottom electrode 525 are supported by multiple sidewall anchors 503 which can also be distributed across the entire substrate wafer 501 based on need, rather than being limited to peripheral areas. There is no central pedestal and a separate peripheral compliant support structure. Only multiple sidewall anchors 503 distributed across the entire device element area are required to support the middle spring layer 520 and the bottom electrode 525. Each sidewall anchor serves both as a support to the bottom electrode and as an anchor to a corresponding cantilever (or two cantilevers in the configuration shown in FIG. 5C, one on each side of the sidewall anchor 503).

With this design, a cMUT element with a very large active area may be formed. The operating frequency of the cMUT element may be adjusted not only by selection of the materials for the top plate 540 but also by the configuration of the multiple cantilevers, including the spring strength of individual cantilevers and the cantilever distribution density profile across the area of the cMUT element.

In principle, a cMUT element of the present invention may have an active area significantly larger than what would be possible with the conventional cMUT structures. The active area of a cMUT may be defined as the total movable area. For cMUT elements of a comparable overall size (cMUT element area), the active area of the cMUT element of the present invention may still be much greater than the total active area of the multiple cMUT cells in a conventional cMUT element. For example, the active area of the inventive cMUT is close to 100% of the element (device) area, while the total active area of multiple cMUT cells in a conventional cMUT element may cover about 60-90% of the element (device) area. Usually, the higher the operation frequency is, the lower the active area percentage is for a conventional cMUT. In addition, even for a given movable area, the cMUT of the present invention potential yields a greater effective active area, which may be defined as the area of the effective electric field activating the capacitors.

The entire top plate 540 formed above the substrate wafer 501 may be movable without any clamped or fastened area. If desired, multiple cMUT elements can be formed by forming separation trenches 515 through the top plate 540. In some configurations, the suppression trench may also cut through the middle spring layer 520. In principle, however, the entire cMUT structure with a very large active area may be used as a single cMUT element.

Furthermore, unlike the flexible membrane clamped on its edges (or posts) in the conventional cMUTs, the top plate 540 shown in FIGS. 5A-5D can be designed to be either flexible or rigid. With a rigid top plate, the whole surface of the cMUT, which may include any number of separate smaller top plates 540, may be movable with a very uniform displacement profile.

A transducer may also comprise basic building units in single cantilevers which is a half of either the back-to-back double cantilever or head-to-head double cantilever. Although this may not be the most efficient structure in terms of fabrication process, with novel fabrication methods disclosed in the several other patent applications identified herein filed by the common applicant on even date it is feasible to make such a transducer.

The location of the top electrode 550 may be at any position above the transducing space 560. The bottom electrode 525 can reside on the substrate wafer 501 and/or on a part of the middle spring layer 520. The top plate 540 is actuated by the applied electrode field between two electrodes 550 and 525 to transmit the ultrasound into the medium, and the ultrasound can be detected if it impinges on the top plate 540 cause the capacitance between two electrodes 550 and 525 to change.

In the exemplary cMUT structure 500 shown in FIGS. 5A-5D, the sidewall anchor 503 is an integral part of the substrate 501. It is appreciated that other configurations may be used to create the cavities 502 and the sidewall anchors 503 defined in between the substrate 501 and the middle spring layer 520. For example, a part or the whole sidewall anchor 503 may either be a separate layer introduced between the middle spring layer 520 and the substrate 501, or an integral part of the middle spring layer 520.

The middle spring layer 520 as shown is a continuous layer placed over the top of the multiple sidewall anchors 503 and a multiple cavities 502. The middle spring layer 520 thus occupies the entire device element area longitudinally (i.e., in the lateral or surface dimension) in the embodiment shown. This configuration allows the entire top plate 540 to be supported by cantilevers through connectors 530 that can be placed or distributed all over the entire device element area without being limited to places near the edge of the element. It is appreciated, however, that the middle spring layer 520 may comprise multiple small segments that are either connected to each other at certain points or completely separated from each other. Particularly, segments of middle spring layer 520 may be used in a way where each segment is connected or anchored to a respective sidewall anchor 503 and covers at least part of a respective cavity 502 to allow cantilevers to be formed, but leaves part of the top surface of the sidewall anchors 503 uncovered. Such a configuration may allow the flexibility of using different materials and different thicknesses for the middle spring layer 520, but may complicate the fabrication process.

Regardless of the configurations of the middle spring layer, it is envisioned that in some preferred embodiments, the cantilever-forming anchor surface(s) (the top surface of the sidewall anchors 503) and the associated cantilever areas of cMUT element 500 together cover at least half of the device element area in order to achieve an effectively distributed cantilever-support of the top plate 540 and greater effective active areas. The cantilever areas may be defined as the total area of the cavities, or alternatively as the total area of the middle spring layer 520 covering the cavities. Preferably the cantilever-forming anchor areas and the cantilever areas are at least 80% of the device element area, and further preferably near 100% of the device element area, as is the case showing in FIG. 5A. Pedestals that do not serve to anchor a cantilever is not required, and preferably not formed at all within the device element area of the substrate wafer 501 in order to maximize the cantilever-forming anchor areas as described above. In some embodiment, the cantilever areas and the associated connector areas are minimized while the cantilever-forming anchor areas are maximized for higher effective electrical field area. For a given number of the cantilevers, the cantilever area may be minimized by using a thinner middle spring layer with shorter cantilever dimensions while still achieving desired spring strength. These configurations provide a potential advantage over the prior art designs that have peripheral support for clamped membranes.

Within the general principle of the present invention, there is a great room of design freedom in terms of the overall size of each addressable device element, the size, shape and arrangement of the cavities, the size, shape and arrangement of the anchors for cantilevers, the size, shape and arrangement of the connectors, and the thickness, shape, segment (separation) pattern and material selection of each layers (the substrate wafer, the middle spring layer and the top plate layer).

A cMUT element built using the basic building units in accordance with the present invention is no longer necessarily made of multiple cells each having a flexible membrane. Instead, the cMUT element may have a single (rigid or flexible) top plate. Even if multiple top plates are used, these top plates do not need to be clamped at some cell boundaries like the membranes for each cell in the prior art. The multiple top plates further do not need to be identical to each other. Generally, even with multiple top plates, only a small number of the top plates would be necessary for each addressable device element, much fewer than the number of individually clamped cells that would have been required in conventional cMUT designs.

The cantilevers formed from the spring middle layer function as embedded springs that can be of a variety of spring strength, size and density variations. These embedded springs may be made of a single contiguous flexible membrane or multiple flexible membranes of identical or different size and shape. The locations of the plate-spring connectors (e.g., connectors 530) may be designed to obtain the optimal displacement for the top plate or the desired frequency response for the cMUT during the cMUT operation. The configuration of the top plate 540, such as using smaller top plate segments, may also be adjusted to achieve desired frequency response for a CMUT element with a relative large size.

In summary, unlike the cMUTs in the prior art, there may be no clamped (or fixed) area on the transducer surface in some embodiments of this invention, and the top surface of the cMUT may be made of a single top plate or multiple top plates which are supported by springs (cantilevers) deployed at strategic locations. As a result the cMUT built using the basic building units in accordance with the present invention has the potential to solve many problems of the prior cMUTs mentioned in the background section. The potential advantages may include:

(1) Since the entire top surface of the transducer is movable with a much more uniform displacement, both the average displacement and the average electrical field between two electrodes of the cMUT element may be improved. This may lead to better transmission and reception performances.

(2) With the design of the present invention, it is possible to make a transducer with no or very little inactive surface area so that the device fill factor can be near perfect. This is especially important for a high frequency cMUT because the transducer dimension is small.

(3) The parasitic capacitance of the transducer can be dramatically decreased by selecting proper properties of the middle spring layer. For example, non-conductive materials may be used for the middle spring layer. This improves the transducer sensitivity.

(4) The transducer breakdown voltage can be improved by using a proper material for the middle spring layer so that a high electrical field may be obtained between two electrodes to improve the device performance.

(5) The uniformity of the cMUT surface displacement can be further improved by increasing the stiffness of the top plate. With a properly chosen thickness of the top plate, the cMUT surface displacement may have minimum impact or no impact on ultrasonic beam pattern emitted from the transducer surface.

(6) Because the cMUT cell boundary pattern within the cMUT element surfaces can be eliminated with the new design, there is no high frequency limitation caused by such cell boundary patterns. This may improve the bandwidth of the cMUT.

(7) Without having to use a great number of cells in each cMUT element, the phase difference of the motion at the different locations (different cells) on the cMUT surface is minimized. This is true especially if a rigid top plate is used. This can improve the device performance, especially when the cMUT works in a high quality factor (Q-factor) condition, e.g., in air or low pressure environment.

(8) The anchors (sidewall anchors 503 for anchoring the middle spring layer 520) of the cMUT may be made slightly smaller than the top plate so that there is more room at the cMUT element edge for adding decoupling structures between the cMUT elements to reduce the cross coupling.

(9) The present invention provides more design flexibility for the MUTs than those of the prior arts. For example, the top plate 540 may be designed to be of different shapes and configurations; the embedded springs (e.g. cantilevers made from the middle spring layer as shown in FIGS. 5A-5D) may have different shapes and different spring constants by selecting the proper membrane dimensions. Moreover, the embedded springs can attach to the different locations on the top plate 540.

As described in the several patent application is identified herein filed by the common applicant on even date, wide varieties of formations are available within the spirit of the present invention. Islands may be formed on the substrate wafer by forming cavities. Although in principle not all islands must serve as an anchor to form a cantilever, it is preferred that as many as islands are effectively utilized as anchors to optimize the performance and design freedom.

Multiple cantilevers may be formed in the cantilever-forming area. The middle spring layer may have a plurality of connectors connecting to the top plate layer. The plurality of connectors may be distributed across the device element area to define a connector density profile indicating an average connector density per area at each location on the middle spring layer. Each connector and its corresponding cantilever may be considered as a spring having a spring strength, which when combined with the respective average connector density at the location can define an effective spring intensity profile. For example, the effective spring intensity may be defined as spring strength per unit area at a location, which would be determined by combining the spring strength of individual cantilevers and the number of cantilevers in a unit area (spring density).

The anchors (e.g., sidewall anchors 503) and their corresponding connectors may be distributed across the substrate wafer in any pattern to achieve desired support characteristics such as device frequency responses and mode shapes.

The top plate 540 may be made with a variety of materials and configurations. When combined with various cantilever/connector distribution patterns, different properties such as operating frequency may be achieved.

FIGS. 6A-6E show examples of top plate configurations combined with spring (cantilever) distribution profiles.

Figure 6A:
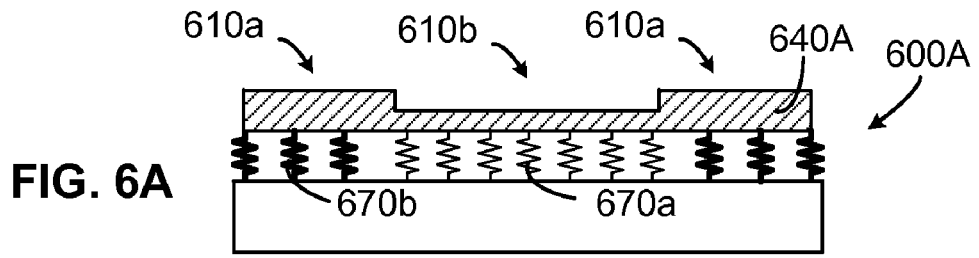
FIGS. 6A-6E show examples of top plate configurations combined with spring (cantilever) distribution profiles.

FIG. 6A shows a cMUT element 600A having two types of cantilevers represented by springs 670a and stronger springs 670b. In this example, the device element area comprises a first region 610a and a second region 610b. The thickness of the top plate layer 640A is greater in the first region 610a than in the second region 610b. The thickness in the first region 610a may correspond to a normal thickness of the top plate layer 640A and the smaller thickness in the second region 610b may correspond to a bottom thickness of a cavity formed on the top plate layer 640A.

Figure 6B:
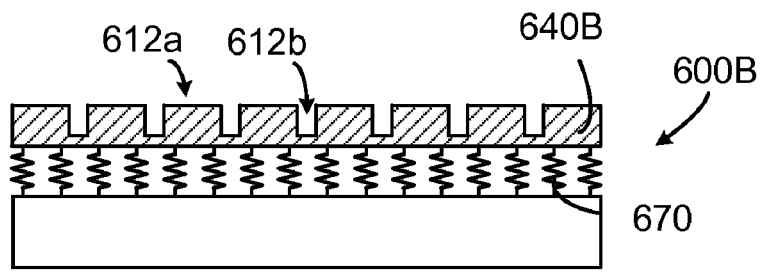

FIG. 6B shows another cMUT element 600B having a plurality of cantilevers represented by springs 670. In this example, the top plate layer 640E has a thickness profile having two different thicknesses 612a and 612b alternating across the device element area. The greater thickness may correspond to a normal thickness of the top plate layer 640B while the smaller thickness may correspond to a bottom thickness of a cavity formed on the top plate layer 640B. The two thicknesses 612a and 612b may regularly alternate across the device element area. This configuration may help to improve the rigid/mass ratio of the top plate.

Figure 6C:
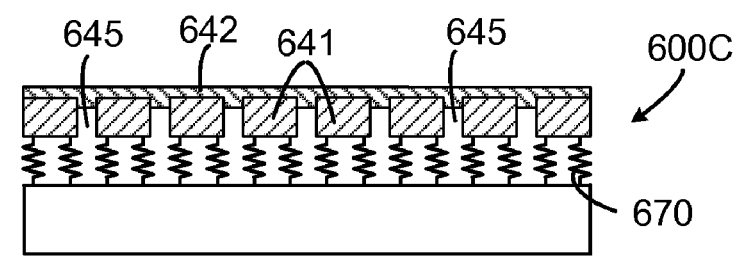

FIG. 6C shows another cMUT element 600C having a plurality of cantilevers represented by springs 670. In this example, the top plate layer 640C is made of two different materials. The first material may make up a plurality of segments 641 divided by separation trenches 645. The second material may be provided as connectors which connect the segments 641 by spanning over the trenches 645. The second material 642 may fill or partially fill the trenches 645.

Figure 6D:
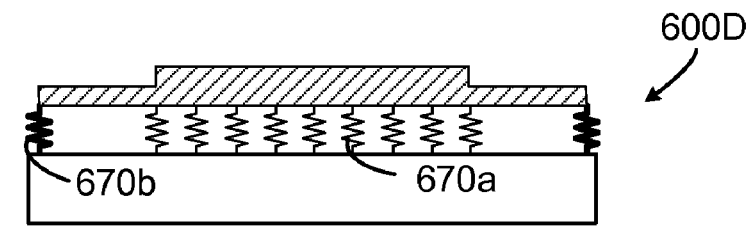

FIG. 6D shows another cMUT element 600D having two types of cantilevers represented by springs 670a and stronger springs 670b. The stronger springs 670b are deployed at edges (perimeter) of the cMUT element 600D. In this example, the top plate layer 640D has a thickness profile in which the top plate layer 640D is thicker in a central region than in a region close to the perimeter of the cMUT element 600D.

Figure 6E:
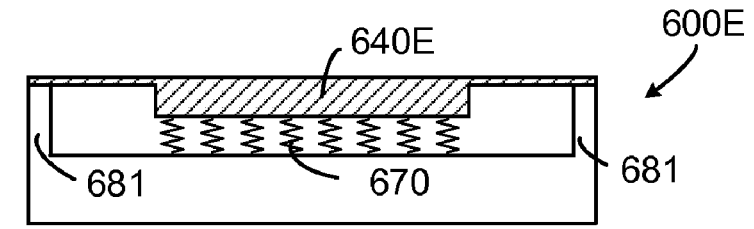

FIG. 6E shows another cMUT element 600E having a plurality of cantilevers represented by springs 670 which are uniformly distributed in a middle region of the cMUT area. In this example, the top plate layer 640E has a thickness profile in which the top plate layer 640E is significantly thinner in the perimeter of the cMUT element then in the middle region. In one embodiment, the top plate layer 640E is very thin and flexible near the parameter but rigid in the middle region. The top plate layer 640E may even be clamped (or fixed) or nearly clamped at perimeter sidewalls 681 without the support of a cantilever (spring). Even in this special case, however, there are no clamped (or fixed) areas within the surface of cMUT elements except for the edges, and the cMUT element 600E still has at least a central portion of the top plate layer 640E supported by the embedded springs located underneath to move in the piston-like motion. Therefore, the cMUT in such special configurations would still benefit from the potential advantages of the present invention over the conventional cMUTs.

Many other possible cMUT designs for the top plate and embedded springs may be made with the present invention.

Taking advantage of the design flexibility in the present invention, the transducer can be made to have a desired frequency response and optimal transmission and reception performances. In addition to the variations of cantilever distribution profiles and the material selection, mass and thickness profiles of the top plate layer as shown above, other features or variations of embodiments may be incorporated into the micro-electro-mechanical transducer in accordance with the present invention.

One application of the basic design of the micro-electro-mechanical transducer of this invention is to take advantage of a relatively thick and rigid top plate of a transducer built in accordance with the present invention to build additional features on top of the transducer. The top plate of the transducer accommodates as a platform for such additional fabrication.

For example, an additional cMUT based capacitor may be built on top of the first cMUT structure to make a stacked two-capacitor cMUT. The stacked capacitors may be used for a variety of combinations including separated transmission and reception, double transmission, or double reception.

In a regular cMUT element, one capacitor (or multiple capacitors connected in parallel to each other) is usually used for both transmission and reception (detection). Sometimes it may be desirable to have two capacitors that can be configured in various combinations. Conventionally, in a design which uses a first capacitor for transmission and a second capacitor for reception, two capacitors are placed side by side. There are some drawbacks associated with this approach. First, the transducer occupies a larger area. This is particularly undesired for a transducer with a large number of elements. Second, since the capacitors for the transmission and reception are located at the different surface positions, and may further have different shapes or patterns, discrepancies rise to result in different beam patterns between the transmission and reception and may have other undesired impacts on the system performance (such as the accuracy of ranging and imaging) without extra calibration efforts.

According to one aspect of the present invention, two capacitors are stacked together. The design allows the shapes and patterns of both capacitors to be identical at least in the lateral directions. In addition, the locations of two capacitors are the same on the transducer surface with only a slight different depth, whose effects usually can be ignored because the depth difference is much shorter than the ultrasonic wavelength around the operation frequency.

With the basic cMUT structure in accordance with the present invention, there may be many transducer configurations and associated fabrication methods to embody the stacked capacitor design of the present invention. Some of the examples are described below with references to FIGS. 7-12.

Figure 7:
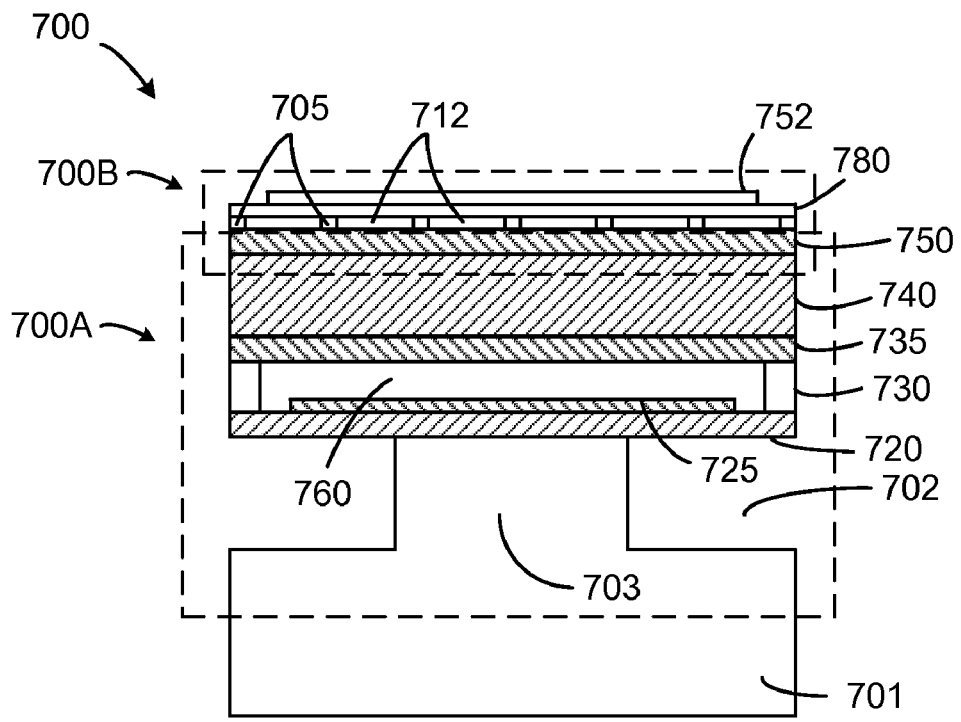
FIG. 7 shows a cMUT with stacked capacitors in accordance with the present invention.

FIG. 7 shows an exemplary cMUT with stacked capacitors in accordance with the present invention. The regions for two stacked capacitors are indicated by two broken-lined boxes 700A (the first capacitor) and 700B (the second capacitor). The cMUT 700 has substrate 701, sidewall anchor 703, substrate cavity 702, middle spring layer 720 placed on top of sidewall anchor 703, first electrode 725 which is the bottom electrode of the first capacitor, connectors 730, insulation layer 735, top plate layer 740, second electrode 750 which is both the top electrode for the first capacitor and the bottom electrode for the second capacitor, top cavities 765, membrane support walls 705, membrane 780, and the third electrode 752 which is the top electrode of the second capacitor.

It is appreciated that many parts, such as the insulation layer 735 shown in FIG. 7 are optional. The first electrode 725 as a separate layer, for example, is optional if the substrate (and the part of the middle spring layer) is conductive. Both the substrate cavity 702 and the top cavities 712 may be vacuum sealed in immersion applications.

The above design shown in FIG. 7 is based on the first cMUT capacitor 700A with embedded springs (cantilevers) underneath the top plate 740 in accordance with the basic micro-electro-mechanical transducer design of the present invention. The second cMUT capacitor, which may be of any available design, is built on the top of the top plate 740 of the first embedded-spring cMUT. In the embodiment shown in FIG. 7, the second cMUT has a conventional design in which the compliant membrane 780 is designed to vibrate in relation to the bottom electrode (the common electrode 750) under the cavities 712. The top plate layer 740 (or the common electrode 750) may serve as the ground or a bias electrode. Therefore the top plate layer 740 (or the common electrode 750) can shield the coupling between transmission signal and reception signal during the device operation.

The two cMUT capacitors are fabricated at the same wafer location. The first cMUT with the first capacitor 700A with a desired design is fabricated first, and the second cMUT with the second capacitor 700B with a desired design is then fabricated on top of the first cMUT. Both cMUTs share the same common electrode 750.

Further integration may be accomplished based on the above design. For example, if the material of the top plate layer 740 of the first cMUT is properly chosen (e.g., a single crystal silicon layer with proper doping level and thickness), an integrate circuit (IC) may be fabricated on the top plate 740 after finished the first cMUT, preferably before the common electrode 750 is deposited. The second cMUT is then fabricated on the top of the integrated circuit (IC). With this in threaded design, the front-end circuit built on the top plate 740 is very close to the transducer 700, and as a result the noise and the parasitic capacitance are dramatically reduced. Therefore, the cMUT performance may be further improved.

Figure 8:
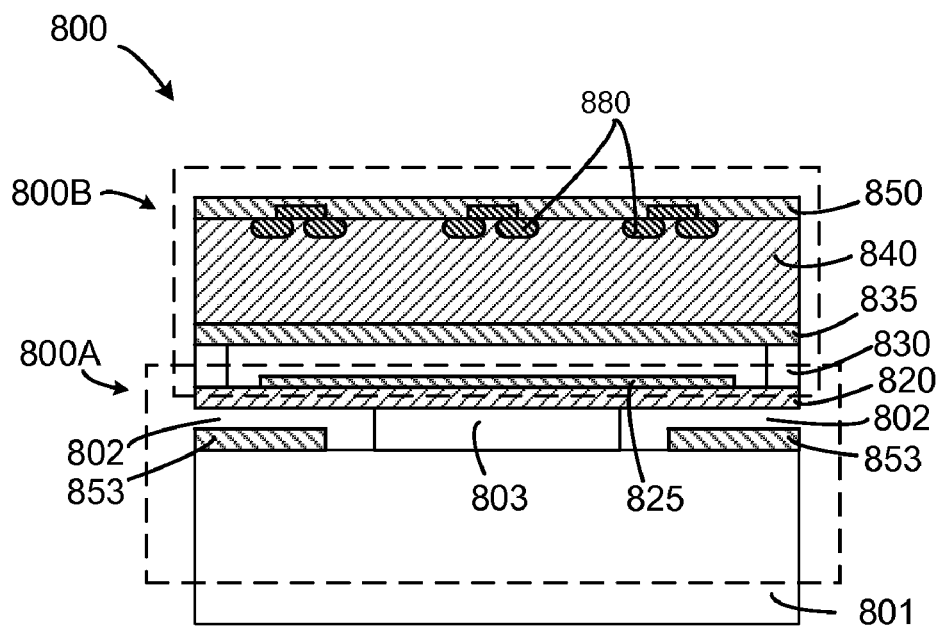
FIG. 8 shows another example of a cMUT structure with stacked capacitors in accordance with the present invention.

FIG. 8 shows another example of a cMUT structure with stacked capacitors in accordance with the present invention. The regions for two stacked cMUT capacitors are indicated by two broken-lined boxes 800A (the first capacitor) and 800B (the second capacitor). The cMUT 800 has substrate 801, sidewall anchor 803, substrate cavity 802, the first electrode 853 which is the bottom electrode for the first cMUT capacitor 800A, middle spring layer 820, the second electrode 825 which is both the top electrode for the first cMUT capacitor 800A and the bottom electrode for the second cMUT capacitor 800B, connector 830, insulation layer 835, top plate layer 840, and the third electrode 850 which is the top electrode for the second cMUT capacitor 800B. In addition, the cMUT 800 also has ICs 880 integrated on the top plate layer 840.

The cMUT 800 is also based on the cMUT with embedded springs (cantilevers) underneath the top plate. Unlike cMUT 700 in which additional top cavities 712, support walls 705 and membrane 780 are built for the second cMUT capacitor 700B, cMUT 800 accommodates the second cMUT capacitor 800B using the basic structure of the first cMUT capacitor 800A without adding additional cavities and support walls. In the particular embodiment shown in FIG. 8, the substrate 801 is made of a nonconductive material (e.g. glass, sapphire, the silicon covered by insulation layer, etc). The sidewall anchor 803 may be a different material added to the substrate 801. The first electrode 853 (the bottom electrode of the second capacitor) may be a patterned conductive layer placed on the substrate 801. As is the case with the substrate of the present invention in general, the substrate 801 can also be replaced by a printed circuit board (PCB) with desired circuits, or a wafer with desired ICs. The substrate 801 and the first electrode 853 in this embodiment may also come together as a wafer with desired ICs and metal patterns.

The cMUTs 700 and 800 may be fabricated using any available techniques, especially the fabrication methods disclosed in the several other patent applications identified herein filed by the common applicant on even date.

The stacked capacitors in the cMUTs 700 and 800 shown above may be wired and configured in various ways to realize a certain function or performance. Examples of the connection schemes are illustrated with references to FIGS. 9-12.

FIG. 9 shows a common prior art connection scheme in which a single capacitor is used for both transmission and reception (detection). The capacitor C (which is a symbolic representation of an addressable cMUT element) is connected to a bias 910 and to transmission control circuit 930 and reception control circuit 940 through a switch box 920, which switches between transmission control circuit 930 and reception control circuit 940.

The basic structure of a prior art cMUT is a variable capacitor C. In the transducers designed for most applications, the same capacitor C (or cMUT) is used for both the transmission and reception as shown in FIG. 9. There are several drawbacks for this approach. First, it needs a switch circuit to protect the preamplifier of the reception circuit. Even with a switch circuit, the transmission signal may still couple to the reception circuit 940 through parasitic capacitance and affects the performance. Second, since both transmission and reception operations use the same capacitor C (cMUT), the whole device performance is a trade-off between the transmission and reception performances.

The stacked capacitors in accordance with the present invention enable various alternatives to the prior art design. FIG. 10 shows a first exemplary capacitor connection scheme in which two stacked capacitors are used for transmission and reception separately. The stacked capacitors C1 and C2 (which are symbolic representations of a stacked cMUT structure, such as cMUT structures 700 and 800 in accordance with the present invention) are connected to a bias 1010 through the middle (common electrode) of the capacitors C1 and C2. The capacitor C1 is dedicated to transmission through transmission control circuit 1030. The capacitor C2 is dedicated to reception through reception control circuit 1040. This design enabled by the present invention may have several potential advantages. A switch circuit is no longer needed to protect the preamplifier of the reception circuit. The electric signal from transmission is shielded by the middle bias electrode (common electrode) connected to the bias 1010, so the cross-talking between transmission and reception is minimized. As a result, the front-end reception circuit can be optimized without being concerned about issues such as saturation from the coupling of the transmission signal. Furthermore, since the transmission and reception operation use different capacitors (cMUTs), there is no need to make a trade-off between transmission and reception performances. Both performances can be optimized at the same time. Such optimization may dramatically improve the whole device performance. For example, the reception capacitor C2 (cMUT) may have a very thin insulation layer and a very narrow gap so that a low DC bias voltage is required. This may significantly increase the capacitance of the reception cMUT and improve the cMUT sensitivity.

In addition, depending on the need, the stacked capacitors enabled by the present invention may be configured in other ways as well. FIG. 11 shows a second exemplary connection scheme in which both capacitors are dedicated to transmission. Like the first scheme in FIG. 10, the stacked capacitors C1 and C2 are connected to a bias 1110 through the middle (common electrode) of the capacitors C1 and C2. Both capacitors C1 and C2 are dedicated to transmission through transmission control circuits 1130 and 1140, respectively. A cMUT element having this connection scheme may be used in combination of another cMUT element, such as in tandem with a cMUT element using a scheme shown in FIG. 12 below, to improve the performance.

FIG. 12 shows a third exemplary connection scheme in which both capacitors are dedicated to reception. The stacked capacitors C1 and C2 are connected to a bias 1210 through the middle (common electrode) of the capacitors C1 and C2. Both capacitors C1 and C2 are dedicated to reception through reception control circuits 1230 and 1240, respectively. A cMUT element having this connection scheme may be used in combination of another cMUT element, such as in tandem with a cMUT element using a scheme shown in FIG. 11 above, to improve the performance.

There are many possible combinations of material properties and size, shape and locations of the components in the micro-electro-mechanical transducer in accordance with the present invention. Electrically, any combination of the material and complement selections desirably should prevent the electrical shorting between two cMUT electrodes. The combination desirably should also enhance the electrical field between the two electrodes for a given input voltage and reduce the parasitic capacitance of the cMUT. It is also important to select materials with better reliability. For example, the mechanical reliability of the middle spring layer is important since this layer bears the maximum mechanical stress of the device. For this consideration, single crystal silicon is a good selection. In addition, the conductivity of the middle spring layer may be designed to be very low to reduce the parasitic capacitance. Therefore, a dielectric material (e.g., silicon nitride) is suitable. If single crystal silicon is selected as the material for the middle spring layer, low-doping level or intrinsic silicon may be used as a starting material for the middle spring layer, which may be subsequently selectively and highly doped in areas designed to be the bottom electrode.

Figure 13:
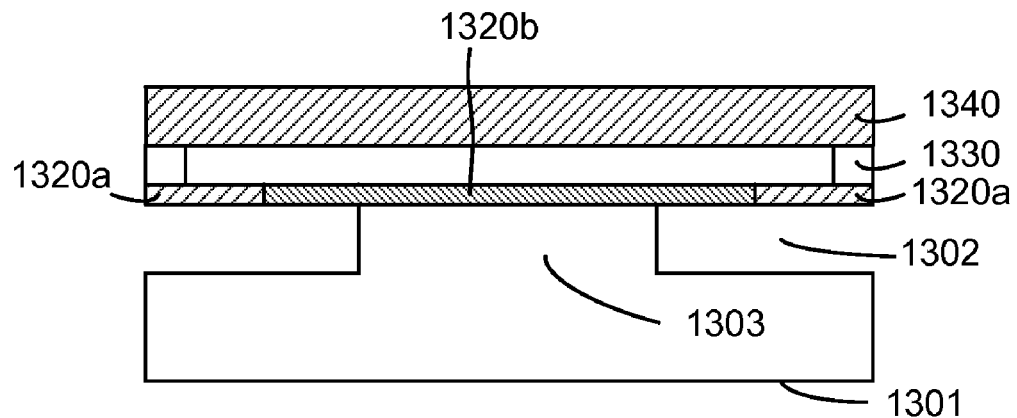
FIG. 13 shows an example of doping profile of a silicon middle spring layer.

FIG. 13 shows an example of doping profile of a silicon middle spring layer. Similar to other MUT structures shown herein, the MUT structure in FIG. 13 has cavity 1302 (which can be vacuum sealed in immersion application), sidewall anchor 1303, plate-spring connectors 1330, and top plate layer 1340. The MUT in FIG. 13, however, has a silicon middle spring layer that has two different types of regions, which are intrinsic or very light doped silicon regions 1320*a* and highly doped silicon region 1320*b*. The highly doped silicon region 1320*b* may be effectuated as a bottom electrode to substitute a separate conductive layer deposited on the middle spring layer as the bottom electrode as shown in other embodiments. Alternatively or additionally, the bottom electrode may be effectuated by using a conductive substrate wafer 1301.

Moreover, regardless of how the bottom electrode is fabricated or effectuated, the doping types can be made different between regions 1320*a* and 1320*b* in the middle spring layer of FIG. 13 to form a PN junction between the two regions. This may further increase the breakdown voltage of the transducer and reduce the parasitic capacitance by selecting a proper bias voltage on the PN junction.

In the cMUT structure of the present invention, the top electrode can be located in the any position as long as it moves with the top plate. But the top electrode desirably should be designed to maximize the electric field between two electrodes without electric shorting. For example, if the top plate is conductive (e.g. highly doped silicon), the top electrode (usually a metal layer) may be place on the top of the top plate. If the top plate is not conductive (e.g., using silicon nitride, LTO, or PMMA), the top electrode may be placed at the bottom side of the top plate layer, and preferably on the top of an insulation layer (e.g., insulation layer 535 in FIG. 5C) which is placed over the plate-spring connectors. This helps to obtain a stronger electrical field between two electrodes.

One highly effective method for forming or introducing top plate in a cMUT structure of the present invention is to use wafer bonding technology in which a prime silicon wafer or an SOI wafer having a desired silicon layer on an insulation layer is bonded to the substrate and the middle spring layer. In that case, the resultant top plate would include a silicon layer or polysilicon layer. Such a layer is relatively conductive for the purpose of the applications envisioned in the present invention. Correspondingly, measures to reduce the chance for shorting between the top electrode and the bottom electrode may be used.

An insulation layer such as the insulation layer 535 in FIG. 5C is used to prevent shorting between two electrodes in case the two electrodes contact each other during the operation. The insulation layer can be located on either the top or the bottom side of the activating space defined between two electrodes. The insulation layer 535 in FIG. 5C is an example of the former type configuration. Usually it is preferable to have the insulation layer placed on the side of the top plate instead of having it on the middle spring layer. This is because the properties of the middle spring layer needs to be well controlled, and having an insulation layer thereon may impose an unfavorable restriction for such controlling of the properties and behaviors. The insulation layer may either be a contiguous single layer or be patterned. If the middle spring layer itself is made of a dialectical material (e.g., silicon nitride), the insulation layer may be optional.

The primary function of an insulation layer such as the insulation layer 535 is to prevent the shorting between two the electrodes during the cMUT operation. However, using an insulation layer may introduce drawbacks. First, it may trap some charges which may degrade the reliability of the transducer. Second, there exists a voltage drop cross the insulation layer and this voltage drop may reduce the transducer efficiency, especially for a cMUT (e.g. a high frequency cMUT) that needs a small vertical displacement and a high input voltage.

According to one aspect of the present invention, the above drawbacks may be overcome by eliminating the need for the insulation layer 535 using special designs to perform an equivalent function of the insulation layer.

In one design, the depth (vertical height) of the cavity in the substrate wafer is designed to be smaller than the depth (vertical height) of the available transducing space between the top plate and the middle spring layer. In this design, the middle spring layer would be stopped by the bottom of the cavity in the substrate wafer before the conductive top plate and the top electrode hit the bottom electrode to cause shorting between two electrodes. This would effectively prevent the top plate layer from touching the bottom electrode to cause a short, and thus eliminate the need for an insulation layer under the top plate layer.

If a large depth is desired for the cavity below the middle spring layer, a motion stopper may be introduced in the cavity to achieve a similar function as described below with reference to FIG. 14.

Figure 14:
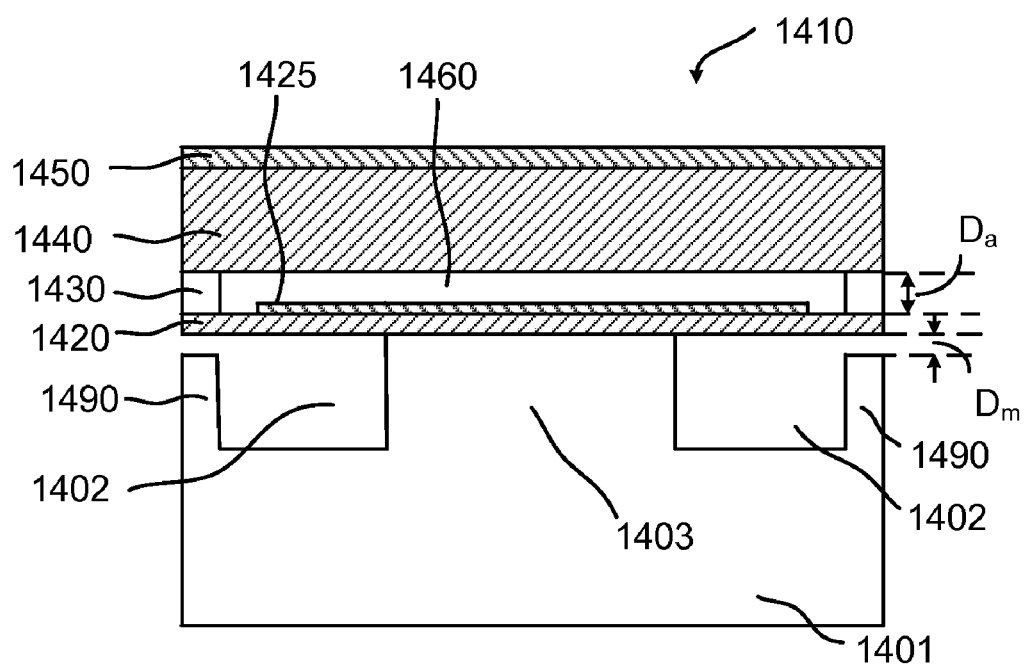
FIG. 14 shows an enlarged view of a selected portion of a cMUT element of the present invention having a motion stopper to limit the maximum vertical displacement of the top plate.

FIG. 14 shows an enlarged view of a selected portion of a cMUT element having a motion stopper to limit the maximum vertical displacement of the top plate. The selected cMUT portion 1410 is similar to the selected cMUT portion 510 in FIG. 5 but has motion stoppers 1490 to prevent shorting. The selected cMUT portion 1410 has two halves centered on an imaginary vertical line (not shown) going through the structure from the top to the bottom. The basic structure of the cMUT element is built on a substrate wafer 1401 and has these components: a cavity 1402 defined by a sidewall anchor 1403, a middle spring layer 1420 which is preferably an elastic membrane, a bottom electrode 1425 placed on the middle spring layer 1400, a connector 1430 which stands on top of the middle spring layer 1420, an insulation layer 1435 sitting over the connector 1430, a top plate 1440, and a top electrode 1450. Unlike the cMUT structure in FIGS. 5A-5D, there is no intervening insulation layer between the top plate layer 1440 and the connector 1430.

The connector 1430 stands out from the middle spring layer 1420 to define a transducing space 1460 below the top plate layer 1440. In this particular embodiment, the actual height $D_a$ of the transducing space 1460 is reduced by the thicknesses of the bottom electrode 1425 and the middle spring layer 1420 in the configuration shown in FIG. 14. The connector 1430 is horizontally distanced from the sidewall anchor 1403 by a sufficient length to define a cantilever anchored at the sidewall anchor 1403. The cantilever and the cavity 1402 enable a vertical displacement of the connector 1430, which transports the top plate 1440 substantially vertically with a piston-like motion, thus changing the transducing space 1460. When the both halves of the cMUT structure 1410 move in the same phase, the vertical piston-like motion is further assured.

As shown in FIG. 14, the maximum vertical displacement $D_m$ of the connector 1430 is limited by a motion stopper 1490 disposed in the cavity 1402. When $D_m$ is designed to be no greater than (preferably smaller than) $D_a$, the vertical displacement of the connector 1430 (and thus the maximum vertical transportation distance of the top plate layer 1440) is limited to be less than the height $D_a$ of the transducing space. This effectively prevents the top plate layer 1440 from touching the bottom electrode 1425 to cause a short, thus eliminating the need for an insulation layer under the top plate layer 1440. In one preferred embodiment, $D_m$ is at least one third less than $D_a$.

The stopper 1490 can be placed at different locations with a desired height. In addition, as in the other designs described herein, the bottom electrode 1425 is optional if the substrate wafer 1401 and/or at least a part of the middle spring layer is conductive.

In general, if the substrate wafer and the middle spring layer are conducted, these layers should preferably be connected together electrically (e.g. to have the same electric potential). Alternatively, either the substrate wafer or the middle spring layer, or both, may be made of insulation materials.

Ideally, the top plate should be light (i.e., with less mass) and rigid. An acoustic ratio of 1st resonant frequency over the total mass of the top plate may be used to evaluate the material selection and structure design of the top plate. A higher value of the acoustic ratio is generally preferred for the top plate. Several different designs considerations are described below.

(1) If the top plate is made of a solid plate of a single material, the selected material itself should have a low mass density and high Young's modulus (e.g., diamond is one of the best materials for such a purpose).

(2) If a certain material is already selected for the top plate, some structure designs may be used to further improve the acoustic ratio. For example, making a material porous usually increases the acoustic ratio defined above. Porous silicon can be formed by electrochemical etching of silicon in an HF rich electrolyte. For another example, the top plate can be micromachined to have a well-designed hollow structure to achieve a larger ratio of 1st resonant frequency over the total mass. The micromachining may be done by etching with a desired mask pattern.

(3) For a given material, certain treatments can be introduced to increase the equivalent Young's modulus of the materials without increasing the mass. One possible way to do this is to introduce a tension stress in the materials. For example, the stress can be introduced in a thin film formation by controlling the process parameters; the stress can also be introduced into silicon by proper doping if the silicon is used.

The above considerations and methods may be also applied to the materials of the middle spring layer.

Both the top plate and the middle spring layer may be micromachined structures such as a porous structure to achieve modified mechanical properties. For example, the top plate may be made of plates with holes built therein. Alternatively, the holes may be half-through cavities formed on top of the top plate without penetrating the entire thickness thereof. Hollow structures such as voids may also be formed within the top plate with no openings or only very small openings on the surface of the top plate.

FIGS. 15A-15D illustrate holed or hallowed structures applied to the top plate to optimize the properties such as the rigidity/mass ratio of the top plate.

Figure 15A:
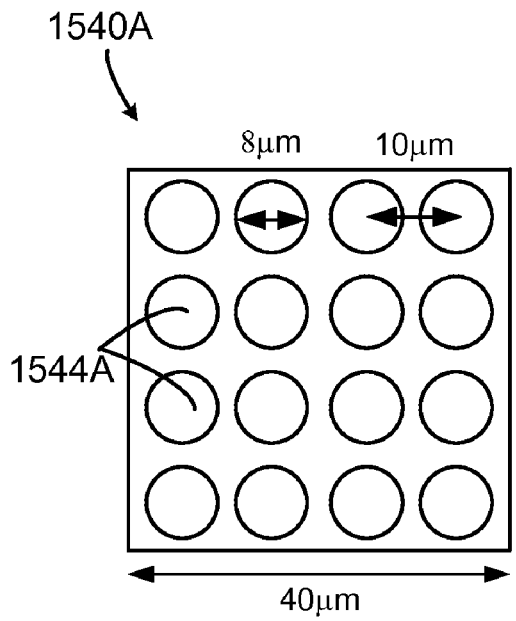
FIGS. 15A-15C show three exemplary configurations of the top plate layer.
Figure 15B:
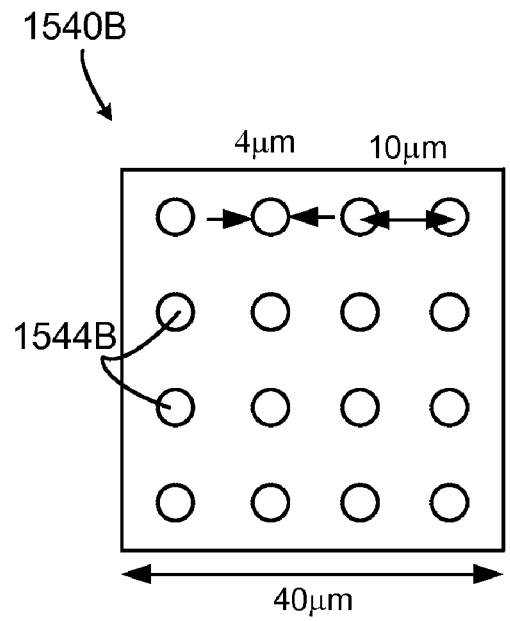
Figure 15C:
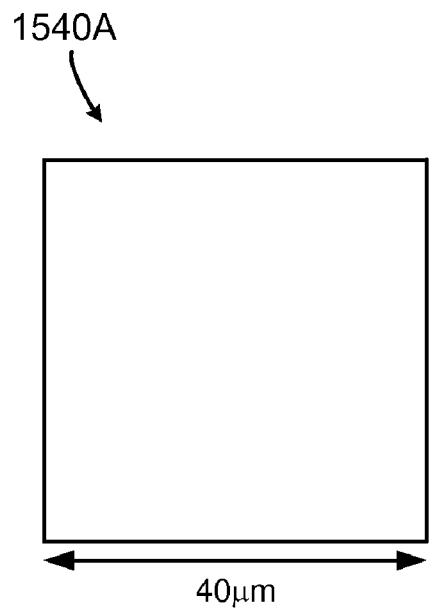
Figure 15D:
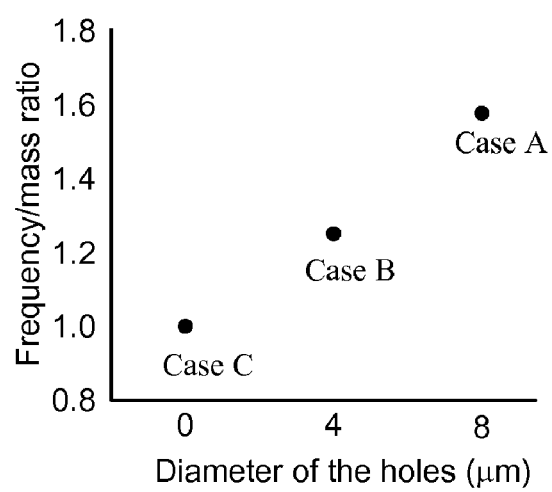
FIG. 15D shows a graph of the corresponding ratio of 1st resonant frequency over the total mass of the top plate as the function of the diameter of the etched holes shown in the three configurations.

FIGS. 15A-15C show three exemplary configurations of a top plate layer of the present invention. FIG. 15D shows a graph of the corresponding ratio of 1st resonant frequency over the total mass of the top plate as the function of the diameter of the etched holes in the three configurations. In the first configuration shown in FIG. 15A, an array of holes 1544A of a diameter of 8 μm is formed on the top plate 1540A. There is a separation distance of 10 μm between the neighboring holes. In the second configuration shown in FIG. 15B, an array of holes 1544B of a diameter of 4 μm is formed on the top plate 1540B. There is a separation distance of 10 μm between the neighboring holes. In the third configuration shown in FIG. 15C, a solid top plate 1540C without holes formed therein is used.

As shown in the graph of FIG. 15D, the first configuration shown in FIG. 15A is a preferred top plate design because it demonstrates the highest rigidity/mass ratio. In these figures, the results of the ratios for three different silicon structure designs for the top plate are normalized by that of a solid silicon plane.

Figure 15E:
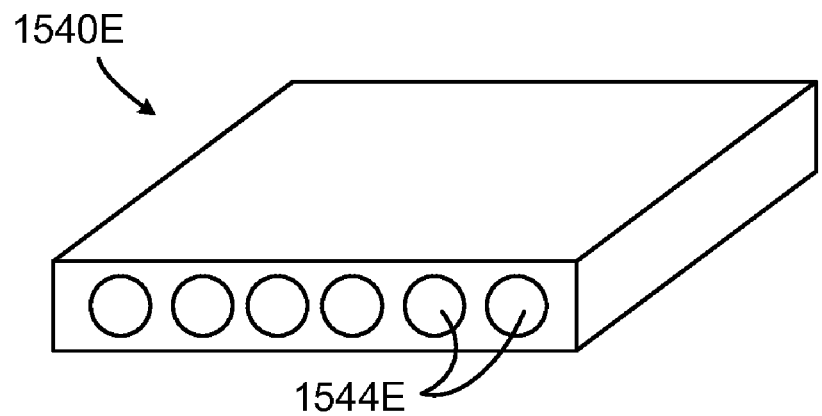
FIG. 15E shows another example of the top plate having holes built therein.

The hollow structures shown in FIGS. 15A-15C are just some examples. It is appreciated that many other possible hollow structure patterns (e.g., hexagon, square, or triangle), with the different shapes, sizes, densities and configurations of the trenches, can be used for the purpose of the present invention. FIG. 15E, for example, shows another example of the top plate having holes built therein. The top plate 1540E has holes 1544E that are built from a side instead of a major surface (e.g. the top surface) of the top plate 1540E.

If needed, the hollow structure can be designed such that the holes may be refilled or sealed using materials with desired properties (e.g., a light and stiff material).

In general, it is preferred that the top plate is significantly more rigid than the middle spring layer and is substantially unbent when transported by the vertical displacement of the connector(s). For example, if the same or similar materials are used for both the top plate layer and the middle spring layer, the top plate layer may desirably be at least three times as thick as the middle spring layer, and more preferably at least five times as thick.

In a capacitance micromachined ultrasonic transducer (cMUT), the bottom electrode may be either on the middle spring layer or on the substrate wafer. In the present description, the term "on" does not necessarily suggest that a separate material or layer is placed on another layer. The bottom electrode may be a part of the middle spring layer or the substrate wafer. For example, the middle spring layer may comprise a conductive material to effectuate the bottom electrode.

In one embodiment, multiple addressable device elements are fabricated on the same substrate wafer. If the substrate wafer is a conductive wafer, the multiple addressable device elements may be insulated from each other by an embedded insulator formed on the substrate wafer. Insulators and the methods of fabricating the same as disclosed in the several patent applications identified herein filed by the common applicant on even date may be useful this purpose. For example, the embedded insulator may have an insulation cavity having a desired overall thickness and being filled with a dielectric material. The embedded insulator may alternatively have a patterned cavity containing solid lines of oxidized native material of the substrate wafer. Similar embedded insulators may be formed on the top plate layer.

The micro-electro-mechanical transducer of the present invention may use various addressing schemes to address the addressable device elements described herein. In particular, the addressable device elements may be addressed from back side of the substrate wafer via a through-wafer interconnect formed through the substrate wafer, as disclosed in the several patent applications identified herein filed by the common applicant on even date. For example, a conductive substrate wafer may be used, and the through-wafer interconnect having an annular trench surrounding a through-wafer conductor made of a native material of the conductive wafer may be used for interconnecting the multiple transducer elements. The through-wafer interconnect may further comprise a dielectric material filled into the annular trench to insulate the through-wafer conductor from rest of the substrate wafer. In one embodiment, the through-wafer conductor is positioned directly underneath the addressable device element.

Although the micro-electro-mechanical transducer of the present invention has been illustrated mostly using a cMUT as an example, other types of transducers such as pMUT and mMUT can also be formed using the same concept in accordance with the present invention.

Figure 16:
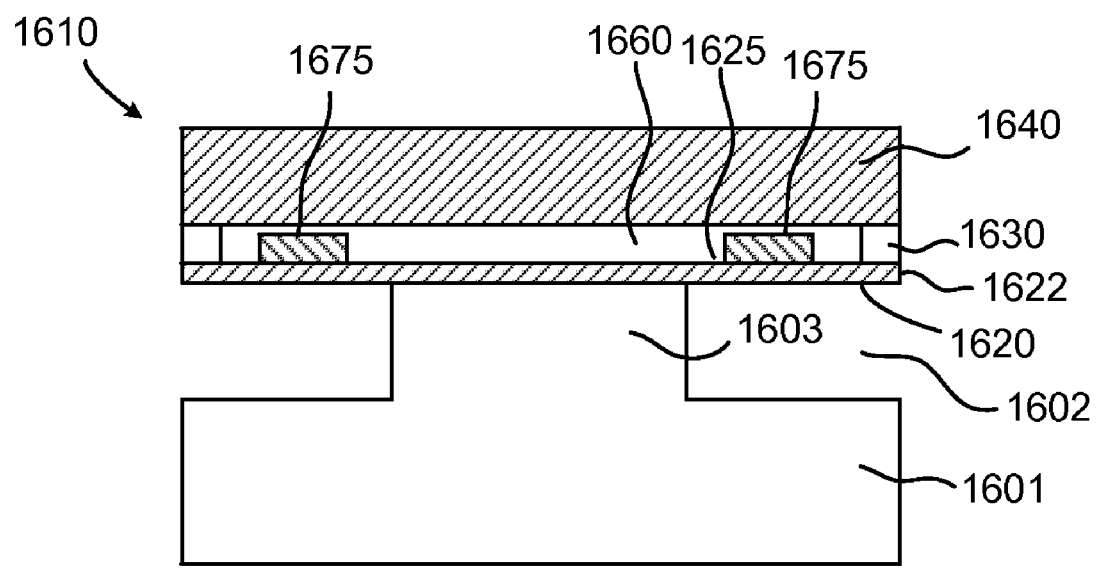
FIG. 16 shows the cross-section view of a section of a pMUT element according to an exemplary embodiment of the present invention.

FIG. 16 shows the cross-section view of a section of a pMUT element according to an exemplary embodiment of the present invention. The pMUT is similar to the cMUT illustrated herein, and has substrate wafer 1601, cavities 1602, sidewall anchors 1603, middle spring layer 1620, plate-spring connectors 1630, top plate 1640, and piezoelectric members 1675 placed on the middle spring layer 1620. Unlike cMUT, the pMUT structure does not have electrodes to form a capacitor having a static electrode and a movable electrode. Instead, a piezoelectric member 1675 function as a transducing member in combination with the cantilevers formed from the resilient middle spring layer 1620. Each piezoelectric member 1675 may include two electrodes sandwiching a piezoelectric layer therebetween. Despite the similarities in the overall structure, the material selection may be different for pMUT because the electric connections in the pMUT transducer are different due to a different energy transformation method.

Figure 17:
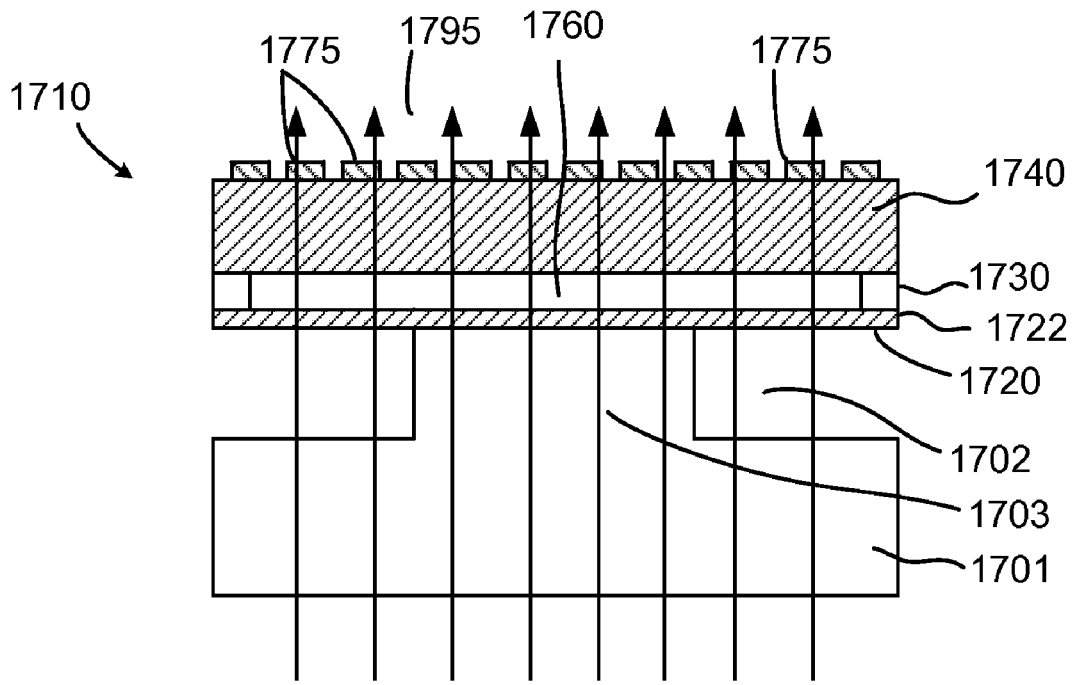
FIG. 17 shows the cross-section view of a section of a mMUT element according to an exemplary embodiment of the present invention.

FIG. 17 shows the cross-section view of a section of a mMUT element according to an exemplary embodiment of the present invention. The mMUT is similar to the cMUT are pMUT illustrated herein, and has substrate wafer 1701, cavities 1702, sidewall anchors 1703, middle spring layer 1720, plate-spring connectors 1730, top plate 1740, and magnetic members 1775 placed on the top plate layer 1740. Unlike cMUT, the mMUT structure does not have electrodes to form a capacitor. Magnetic members 1775 function as a transducing member or energy exchanger activating the top plate in response to the substantially vertical motion of the top plate layer 1740 caused by the cantilevers formed out of the resilient middle spring layer 1720. Despite the similarities in the overall structure, the material selection may be different for mMUT because the electric connections in the mMUT transducer are different due to a different energy transformation method.

Figure 18:
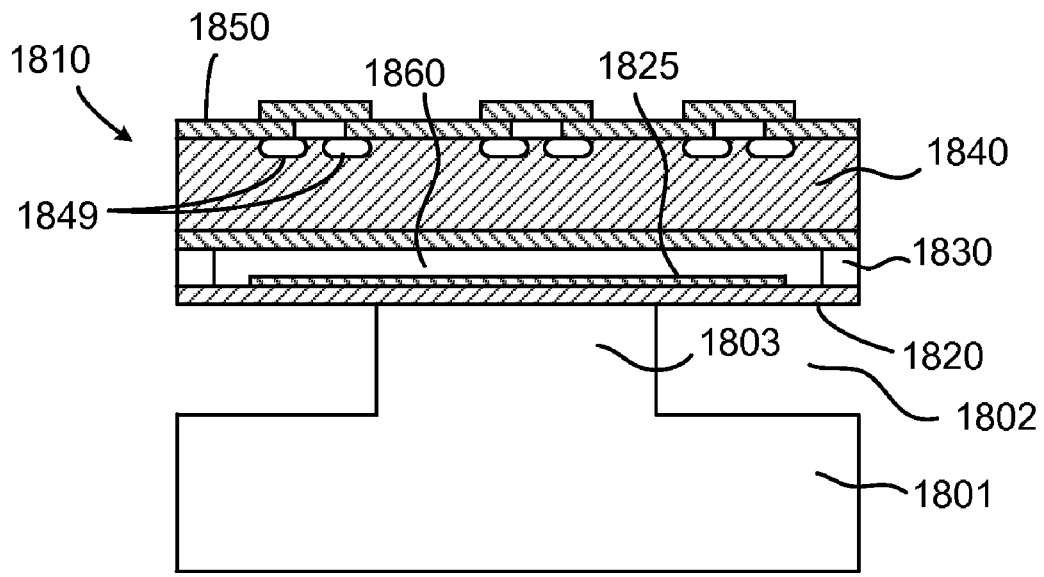
FIG. 18 shows a cross-section view of a cMUT integrated with an IC in accordance with the present invention.

The basic structure of the micro-electro-mechanical transducer described herein may be integrated with integrated circuits (IC). FIG. 18 shows a cross-section view of a cMUT integrated with an IC. The cMUT 1800 includes substrate wafer 1801, cavities 1802, sidewall anchors 1803, middle spring layer 1820, plate-spring connectors 1830, top plate 1840, top electrode 1850, bottom electrode 1825, and integrated circuits 1849 built in the top plate 1840. Metallization may be used to form the top electrode 1850 of the cMUT 1800 and to connect nearby cMUT elements with ICs.

Since the top plate 1840 can be made of single crystal silicon with desired properties (e.g. orientation, doping level and type and the thickness, etc), integrated circuits (IC) 1849 can be fabricated directly on the top plate layer 1840 to accomplish the integration as shown in FIG. 18. The ICs 1849 may be fabricated right after the formation or placement of the tops of his plate 1840. At that stage of the process, the surface of the fabricated wafer with embedded transducers is the bare surface of the top plate layer 1840 which is almost the same as that of a prime wafer. Therefore ICs 1849 can be fabricated by the standard IC fabrication methods. The process after the ICs 1849 have been fabricated should be carefully chosen so that the IC will not be damaged by the subsequent process (e.g., temperature and enchant). Usually, after forming or placing the top plate 1840, no high-temperature process may be required to complete the fabrication of the transducer in order to make the integration feasible.

The ICs 1849 may be fabricated on the top of the cMUT top plate 1840 within the device element area as shown, or fabricated in an adjacent area on the top plate 1840 outside of the device element area (not shown), such as an area between two device elements reserved for IC fabrication.

Alternatively, a wafer with desired ICs preformed can be introduced and bonded with the cMUT wafer during the transducer fabrication to achieve integration. The process after introducing the ICs wafer should be carefully selected to avoid of damaging ICs during the rest process steps.

The micro-electro-mechanical transducer of the present invention may be fabricated using the fabrication methods described in the several patent applications identified herein filed by the common applicant on even date. The fabrication methods for making the basic micro-electro-mechanical transducer of the present invention include (1) Fabrication using wafer-bonding technology; (2) Fabrication Using sacrificial technology; and (3) Fabrication using a combination of wafer-bonding and sacrificial technologies.

The design and fabrication of connections and interconnections disclosed in the several patent applications identified herein may also be used, in addition to any other available designs and methods of interconnections.

The trenches between the micro-electro-mechanical transducer elements may need to be sealed in some applications. For example, a sealing structure may help prevent the medium or moistures leaking into the trench. A sealing structure may also be designed to minimize coupling between elements and to provide electrical connections between the elements. The trenches may be sealed either during or after the device fabrication. Techniques for sealing trenches between the device elements disclosed in the several patent applications identified herein may be used.

The micro-electro-mechanical device such as the cMUT of the present invention may need to interconnect to the outside through bonding wires or the probes. To do this, electrical interface pads (e.g., wire-bonding pads or probing pads) may be needed. The interface pads usually would introduce some undesired parasitic parameters (e.g., parasitic capacitance, or inductance). In order to improve the transducer performance, the parasitic parameters may need to be minimized.

In addition to any available methods for reduction of parasitic capacitance, the novel methods to reduce parasitic capacitance of an interconnection pad by increasing the thickness of an insulator underneath the interconnection pad disclosed in the several patent applications identified herein may also be used. The method allows the thickness of insulation layer on the substrate to be defined by the etching depth instead of the thickness of a film deposition, thus making possible to fabricate insulators of a thickness significantly greater than what would be possible with film deposition techniques.

Additional features on the basic elements micro-electromechanical devices are envisioned and can be fabricated using the methods described below.

Figure 19:
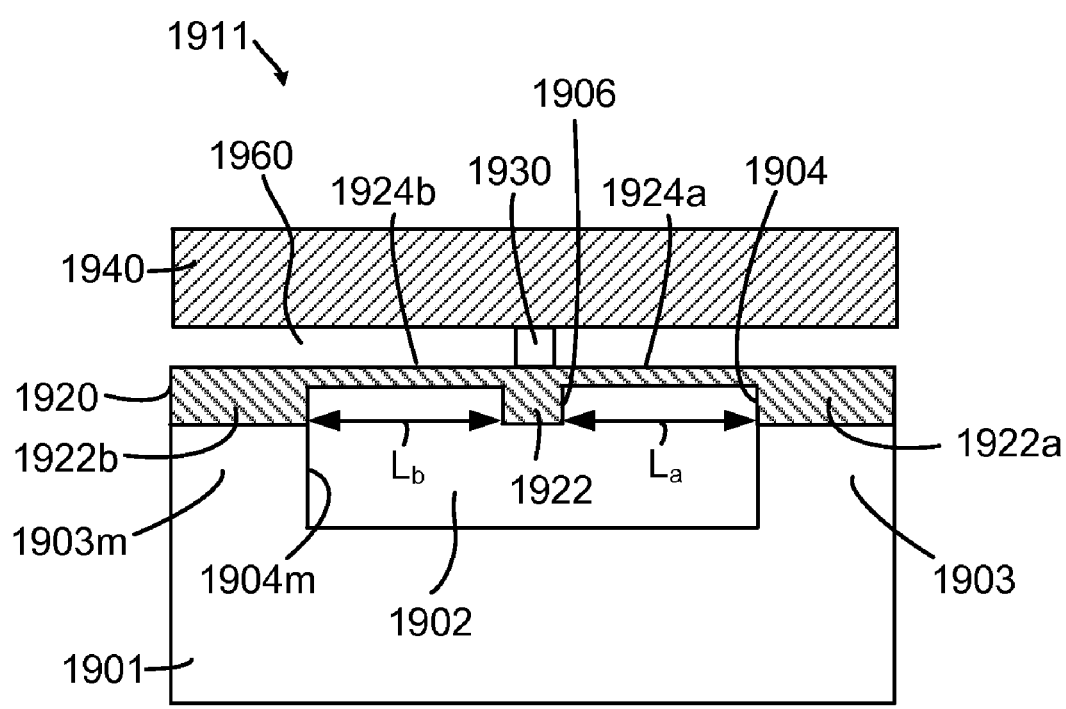
FIG. 19 shows a cross-sectional view of a cMUT structure featuring self-aligned cantilevers.

FIG. 19 shows a cross-sectional view of a cMUT structure featuring self-aligned cantilevers. For better clarity, some optional parts such as the top and bottom electrodes embodied in separate layers and the insulation layer are omitted in FIG. 19. (As discussed herein, although a cMUT structure requires a pair of electrodes to form a capacitor, these electrodes do not have to be embodied in separate layers.).

The cMUT structure 1911 of FIG. 19 is similar to the cMUT portion 511 shown in FIG. 5C. The cMUT structure 1911 is built on a substrate 1901, and has a middle spring layer 1920 and a top plate 1940. A cavity 1902 is defined between the substrate 1901 and the middle spring layer 1920. The cavity 1902 is bordered by two sidewall anchors 1903 and 1903m on two opposite sides. A connector 1930 stands on top of the middle spring layer 1920, and connects to the top plate 1940. The connector 1930 is horizontally distanced from the sidewalls of both the sidewall anchor 1903 and the sidewall anchor 1903m. The middle spring layer 1920 between the sidewall anchor 1903 and the sidewall anchor 1903m defines a double-cantilever anchored at the sidewall anchor 1903 and the sidewall anchor 1903m. The double-cantilever is connected head-to-head at a location where the connector 1930 is positioned to form a bridge. The top plate 1940 is placed over the connector 1930, which separates the top plate 1940 from the middle spring layer 1920 to define a transducing space below the top plate 1940. The double-cantilever and the cavity 1902 enable a vertical displacement of the connector 1930, which transports the top plate 1940 substantially vertically, thus changing the transducing space and activating a transducing member in the transducer for energy transformation.

In the cMUT structures shown in FIGS. 5A-5C, a middle spring layer 520 having substantially uniform thickness is used, and as a result the beam length of the cantilevers formed is determined by the location 520 of the corresponding plate-spring connector 530 relative to the edge location of the respective sidewall anchor 503 or 503m. Precise control of the beam lengths and the corresponding cantilever spring strengths is achieved through precise control of the locations of the plate-spring connectors on the middle spring layer relative to the locations of the respective sidewall anchors. Because in some embodiments of the fabrication method the plate-spring connectors, the sidewall anchors and the cavities are defined in different lithograph steps, there might be difficulties to achieve such precise control. Any alignment error among these different steps may alter the cantilever lengths from their intended values.

In contrast to the cMUT structures shown in FIGS. 5A-5C, the cMUT structure 1911 features self-aligned cantilevers. To achieve this, a thick middle spring layer 1920 is used. Cantilever lengths $L_a$ and $L_b$ are defined by a respective thinner part 1924a or 1924b of the spring membrane layer 1920. In the example shown, the two thinner parts 1924a and 1924b are separated by a thicker part 1922 in the middle of the bridge formed by the spring membrane layer 1920. In the bridge configuration shown here, the thicker part 1922 functions as a cantilever divider. In other configurations, the thicker part 1922 may be a cantilever terminator forming an end of a cantilever on one side only. The two anchoring thicker parts 1922a and 1922b are on top of the two sidewall anchors 1903 and 1903m, respectively. In some embodiments, the two anchoring thicker parts 1922a and 1922b form at least a part of the two sidewall anchors 1903 and 1903m, or even the entire sidewall anchors 1903 and 1903m.

The plate-spring connector 1930 is located on the thicker part 1922. In this configuration, the cantilever length $L_a$ is defined by the distance between the edge 1906 of the thicker part 1922 and the edge 1904 of the thicker part 1922a. The cantilever length $L_b$ is defined similarly. The cantilever lengths $L_a$ and $L_b$ can therefore be predetermined and self-aligned during the fabrication. Any misalignment of the connector 1931 relative to the middle spring layer 1920 (or the thicker part 1922 to be exact), or misalignment of the middle spring layer 1920 (or the thicker parts 1922a and 1922b) relative to the sidewall anchors 1903 or 1903m will have a minimum impact on the effect of cantilever lengths and the corresponding spring strengths of the cantilevers. The cantilever lengths $L_a$ and $L_b$ in the cMUT structure 1911 and the corresponding spring lengths the cantilevers therefore have little or none dependence on any discrepancies among individual fabrication steps.

The above description is given in the context of a cross-sectional view shown in FIG. 19. It is appreciated that in a three-dimensional view, the cantilevers may not be a beam-like formation but instead an area or plane cantilever as defined herein. For example, the thinner parts 1924a and 1924b each may be in a shape of an extended strip, or an ring-like (annular) shape.

The micro-electro-mechanical transducer in accordance with the present invention has been described in detail along with the figures and exemplary embodiments. The transducer potentially can alleviate or eliminate a number of problems with existing technology. The invention has eliminated the necessity of forming an addressable transducer element using a great number of smaller cells. Using the technology, either a much fewer cells are just a single cell may be necessary for each addressable transducer element. The design of the micro-electro-mechanical transducer of the present invention is particularly suitable for application in capacitance micromachined ultrasonic transducers (cMUT), but can also be used for other micro-electro-mechanical devices which have a movable mechanical part to transform energy.

In particular, the micro-electro-mechanical transducer in accordance with the present invention may be fabricated using the novel fabrication methods disclosed in international applications PCT/IB2006/051566, entitled THROUGH-WAFER INTERCONNECTION; PCT/IB2006/051567, entitled METHODS FOR FABRICATING MICRO-ELECTRO-MECHANICAL DEVICES; and PCT/IB2006/051568, entitled MICRO-ELECTRO-MECHANICAL TRANSDUCERS.

In the foregoing specification, the present disclosure is described with reference to specific embodiments thereof, but those skilled in the art will recognize that the present disclosure is not limited thereto. Various features and aspects of the above-described disclosure may be used individually or jointly. Further, the present disclosure can be utilized in any number of environments and applications beyond those described herein without departing from the broader spirit and scope of the specification. We claim all such modifications and variations that fall within the scope and spirit of the claims below. The specification and drawings are, accordingly, to be regarded as illustrative rather than restrictive. It will be recognized that the terms "comprising," "including," and "having," as used herein, are specifically intended to be read as open-ended terms of art.

The invention claimed is:

1. A micro-electro-mechanical transducer having a movable mechanical part to transform energy, the transducer comprising:
a substrate;
a middle spring layer placed over the substrate, the substrate and the middle spring layer defining a first cavity and a second cavity therebetween, the first cavity and the second cavity sharing a standing feature disposed between the substrate and the middle spring layer, the standing feature including a first sidewall bordering the first cavity and an opposing second sidewall bordering the second cavity, wherein the middle spring layer has a first portion connected to the first sidewall and covering at least a part of the first cavity, and a second portion connected to the second sidewall and covering at least a part of the second cavity;
a first connector having a connector height on the first portion of the middle spring layer, the first connector being horizontally distanced from the first sidewall by a sufficient length such that the first portion of the middle spring layer between the first connector and the first sidewall defines a first cantilever anchored at the first sidewall;
a second connector having substantially the same connector height on the second portion of the middle spring layer, the second connector being horizontally distanced from the second sidewall by a sufficient length such that the second portion of the middle spring layer between the second connector and the second sidewall defines a second cantilever anchored at the second sidewall; and
a top plate placed over the first connector and the second connector, the connectors separating the top plate from the middle spring layer to define a transducing space below the top plate and above or across the middle spring layer, the top plate carrying or including a first electrode, the top plate being rigid relative to the middle spring layer and supported by the middle spring layer for vertical movement relative to the standing feature, wherein the first cantilever and the first cavity enable a vertical displacement of the first connector, and the second cantilever and the second cavity enable a vertical displacement of the second connector, the vertical displacements of the connectors transporting the top plate substantially vertically in a piston-like manner relative to the standing feature and the substrate, thus changing the transducing space and activating a transducing member including the first electrode and a second electrode included in or adjacent to the middle spring layer for energy transformation.

2. The micro-electro-mechanical transducer of claim 1, wherein:
the top plate comprises a silicon layer or a polysilicon layer;
the substrate comprises a silicon layer or polysilicon layer; and
the middle spring layer is flexible relative to the top plate and the substrate and has a thickness substantially less than thicknesses of the top plate and the substrate.

3. The micro-electro-mechanical transducer of claim 1, wherein the first cavity and the second cavity are different portions of an extended cavity.

4. The micro-electro-mechanical transducer of claim 1, wherein the first cavity and the second cavity are different portions of an extended cavity, and the first connector and the second connector are different portions of an extended connector.

5. The micro-electro-mechanical transducer of claim 1 wherein the substrate is conductive.

6. The micro-electro-mechanical transducer of claim 1, which is a capacitance micromachined ultrasonic transducer, wherein the transducing member is a capacitor that comprises the first electrode and the second electrode.

7. The micro-electro-mechanical transducer of claim 6 wherein the first electrode comprises a conductive layer deposited on a surface of the top plate.

8. The micro-electro-mechanical transducer of claim 6 wherein the second electrode comprises a separate conductive layer deposited on the middle spring layer.

9. The micro-electro-mechanical transducer of claim 1 in which the middle spring layer is flexible relative to the substrate and has a thickness substantially less than a thickness of the substrate.

10. The micro-electro-mechanical transducer of claim 1 in which each of the first and second cavities have a lateral size that is less than a half wavelength of a 1 MHz to 10 MHz acoustic wave.

11. The micro-electro-mechanical transducer of claim 1 further comprising an insulation layer disposed between the connector and the top plate.

12. The micro-electro-mechanical transducer of claim 1 wherein the middle spring layer is a contiguous layer placed over the standing feature of the substrate and extending over the sidewall to cover at least part of the cavity.

13. The micro-electro-mechanical transducer of claim 1 wherein the middle spring layer comprises a first region and a second region, and wherein the first region comprises a low doped or intrinsic silicon material, and the second region comprises a highly doped silicon material with increased conductivity.

14. The micro-electro-mechanical transducer of claim 13, wherein the first region is close to the connector and the second region is over the top surface of the standing feature, and the first region and the second region form a PN junction.

15. The micro-electro-mechanical transducer of claim 1 wherein the top plate has a thickness profile having at least two different thicknesses to provide a varied flexibility across the transducing space.

16. The micro-electro-mechanical transducer of claim 1 wherein the top plate comprises a first material and a second material different from the first material.

17. The micro-electro-mechanical transducer of claim 16 wherein the first material comprises a plurality of segments divided by separation trenches and the second material connects the segments by spanning over the trenches.

18. The micro-electro-mechanical transducer of claim 1 wherein the top plate comprises holes formed therein.

19. The micro-electro-mechanical transducer of claim 18 wherein the holes have a size and location profile optimized for a desired rigidity/mass ratio of the top plate.

20. The micro-electro-mechanical transducer of claim 1 wherein the top plate is significantly more rigid than the middle spring layer and is substantially unbent when transported by the vertical displacement of the connectors.

21. The micro-electro-mechanical transducer of claim 1 wherein the vertical displacement of the connector is limited to a maximum displacement less than a maximum vertical distance the top plate can be transported through the transducing space.

22. The micro-electro-mechanical transducer of claim 21 wherein the maximum vertical displacement of the connector is limited by a motion stopper disposed in the cavity.

23. The micro-electro-mechanical transducer of claim 1 further comprising an integrated circuit formed in the top plate.

24. The micro-electro-mechanical transducer of claim 1 wherein the substrate comprises a nonconductive wafer and the standing feature is made of a material different from that of the substrate.

25. The micro-electro-mechanical transducer of claim 1 further comprising:
   a second standing feature above the top plate, the second standing feature including a third sidewall defining a third cavity above the top plate; and
   a membrane covering the third cavity, the membrane having a perimeter fixed on the second standing feature, wherein the membrane is adapted for vibrating upon activation by a second transducing member.

26. The micro-electro-mechanical transducer of claim 25 which is a capacitance micromachined ultrasonic transducer, wherein the transducing member comprises the second electrode below the transducing space and the first electrode above the transducing space, and the second transducing member comprises the first electrode and a third electrode above the third cavity.

27. The micro-electro-mechanical transducer of claim 25 wherein the second standing feature is a circular structure.

28. The micro-electro-mechanical transducer of claim 1 wherein the transducing member comprises a first capacitor and a second capacitor, the first capacitor including a third electrode below and spaced from the middle spring layer and the second electrode above the first or the second cavity but below the transducing space, the second capacitor including a fourth electrode above the first or the second cavity but below the transducing space and the first electrode above the transducing space.

29. The micro-electro-mechanical transducer of claim 28 wherein the third electrode comprises an electrode layer deposited on a bottom surface of the first cavity or the second cavity.

30. The micro-electro-mechanical transducer of claim 28 wherein the second electrode comprises an electrode layer deposited on the middle spring layer.

31. The micro-electro-mechanical transducer of claim 28 wherein at least a portion of the middle spring layer is conductive, and the second electrode includes the conductive portion of the middle spring layer.

32. The micro-electro-mechanical transducer of claim 28 wherein the second electrode and the fourth electrode are a common electrode shared by the first capacitor and the second capacitor.

33. The micro-electro-mechanical transducer of claim 1 which is a cMUT transducer wherein the transducing member includes a first capacitor, and the cMUT transducer further comprises a second transducing member including a second capacitor stacked on top of the first capacitor.

34. The micro-electro-mechanical transducer of claim 33 wherein the first capacitor is configured to operate in one of a transmission mode and a receiving mode, and the second capacitor is configured to operate in the other of the transmission mode and the receiving mode.

35. The micro-electro-mechanical transducer of claim 33 wherein both the first capacitor and the second capacitor are configured to operate in a transmission mode.

36. The micro-electro-mechanical transducer of claim 33 wherein both the first capacitor and the second capacitor are configured to operate in a receiving mode.

37. A micro-electro-mechanical transducer having a movable mechanical part to transform energy, the transducer comprising:
   a micromachined semiconductor substrate;
   a middle spring layer placed over the substrate, the middle spring layer carrying or including a first electrode, the substrate and the middle spring layer defining a cavity therebetween, the cavity being bordered by a first standing feature and a second standing feature disposed between the substrate and the middle spring layer, the first standing feature having a first sidewall bordering the cavity and the second standing feature having a second sidewall bordering the cavity on an opposing side, wherein the middle spring layer extends from the first sidewall to the second sidewall to cover the cavity;
   a connector having a connector height on the middle spring layer, the connector being horizontally distanced from both the first sidewall and the second sidewall such that the middle spring layer between the first sidewall and the second sidewall defines a double-cantilever anchored at the first sidewall and the second sidewall and connected head-to-head; and
   a top plate placed over the connector, which separates the top plate from the middle spring layer to define a transducing space below the top plate and above or across the middle spring layer, the top plate being more rigid than the middle spring layer and carrying or including a second electrode,
   the middle spring layer supporting the connector and the top plate, wherein the double-cantilever and the cavity enable a vertical displacement of the connector, which transports the top plate substantially vertically relative to the standing features and the substrate, thus changing the transducing space and activating a transducing member including the first electrode and the second electrode for energy transformation.

38. The micro-electro-mechanical transducer of claim 37, wherein:
   the top plate comprises a silicon layer or a polysilicon layer; and
   the substrate comprises a silicon layer or a polysilicon layer.

39. The micro-electro-mechanical transducer of claim 37, wherein the first standing feature and the second standing feature are different portions of an extended standing feature.

40. The micro-electro-mechanical transducer of claim 37, which is a capacitance micromachined ultrasonic transducer, wherein the transducing member comprises a capacitor that includes the first electrode and the second electrode.

41. The micro-electro-mechanical transducer of claim 40 wherein the first electrode comprises a separate conductive layer deposited on the middle spring layer.

42. The micro-electro-mechanical transducer of claim 40 further comprising an insulation layer disposed between the connector and the top plate.

43. The micro-electro-mechanical transducer of claim 37 wherein the middle spring layer comprises a first region and a second region, and wherein the first region comprises a low doped or intrinsic silicon material, and the second region comprises a highly doped silicon material with increased conductivity.

44. The micro-electro-mechanical transducer of claim 43, wherein the first region is close to the connector and the second region is over the top surface of the standing feature, and the first region and the second region form a PN junction.

45. The micro-electro-mechanical transducer of claim 37 wherein the top plate has a thickness profile having at least two different thicknesses to provide a varied flexibility across the transducing space.

46. The micro-electro-mechanical transducer of claim 37 wherein the top plate comprises a first material in a plurality of segments separated by separation trenches and a second material which connect the segments by spanning over the trenches.

47. The micro-electro-mechanical transducer of claim 37 wherein the top plate comprises holes formed therein.

48. The micro-electro-mechanical transducer of claim 47 wherein the holes have a size and location profile optimized for a desired rigidity/mass ratio of the top plate.

49. The micro-electro-mechanical transducer of claim 37 wherein the vertical displacement of the connector is limited to a maximum displacement less than a maximum vertical distance the top plate can be transported through the transducing space.

50. The micro-electro-mechanical transducer of claim 49 wherein the maximum vertical displacement of the connector is limited by a motion stopper disposed in the cavity.

51. The micro-electro-mechanical transducer of claim 37 wherein the top plate is significantly more rigid than the middle spring layer and is substantially unbent when transported by the vertical displacement of the connectors.

52. The micro-electro-mechanical transducer of claim 37 further comprising an integrated circuit formed in the top plate.

53. The micro-electro-mechanical transducer of claim 37 further comprising:
    a third standing feature above the top plate, the third standing feature including a third sidewall defining a top cavity above the top plate; and
    a membrane covering the top cavity, the membrane having a perimeter fixed on the third standing feature, wherein the membrane is adapted for vibrating upon activation by a second transducing member.

54. The micro-electro-mechanical transducer of claim 37 which is a cMUT transducer wherein the transducing member includes a first capacitor, and the cMUT transducer further comprises a second transducing member including a second capacitor stacked on top of the first capacitor.

55. The micro-electro-mechanical transducer of claim 54 wherein the first capacitor is configured to operate in one of a transmission mode and a receiving mode, and the second capacitor is configured to operate in the other of the transmission mode and the receiving mode.

56. The micro-electro-mechanical transducer of claim 54 wherein both the first capacitor and the second capacitor are configured to operate in a transmission mode.

57. The micro-electro-mechanical transducer of claim 54 wherein both the first capacitor and the second capacitor are configured to operate in a receiving mode.

58. The micro-electro-mechanical transducer of claim 37, wherein the middle spring layer comprises a first region of a first thickness, a second region of a second thickness, and a third region of a third thickness, the second region being between the first region and the third region, the second thickness being substantially smaller than the first thickness or the third thickness, wherein the first region forms at least part of the sidewall, the second region and the third region is disposed over the cavity, and the connector is located on the third region.

59. A micro-electro-mechanical transducer having a movable mechanical part to transform energy, the transducer comprising:
    a substrate carrying or including a first electrode;
    a middle spring layer placed over the substrate, the middle spring layer being relatively flexible and the substrate being relatively rigid, the substrate and the middle spring layer defining a first cavity and a second cavity therebetween, the first cavity being bordered by a first sidewall of a non-conductive standing feature disposed between the substrate and the middle spring layer, the second cavity being bordered by a second sidewall of the non-conductive standing feature, the first cavity and the second cavity forming a transducing space, wherein:
        the middle spring layer extends from the first sidewall to cover at least part of the first cavity and extends from the second sidewall to cover at least part of the second cavity, the middle spring layer carrying or including a second electrode, the first electrode and the second electrode forming a transducing member; and
        each of the first and second cavities have a lateral size that is less than a half wavelength of a 1 MHz to 10 MHz acoustic wave;
    a first connector and a second connector supported by the middle spring layer and having a connector height, the first connector being horizontally distanced from the first sidewall such that the middle spring layer between the first connector and the first sidewall defines a first cantilever anchored at the first sidewall, the second connector being horizontally distanced from the second sidewall such that the middle spring layer between the second connector and the second sidewall defines a second cantilever anchored at the second sidewall; and
    a top plate placed over the first connector and the second connector, the first and second connectors separating the top plate from the middle spring layer to define a hollow space below the top plate and above or across the middle spring layer, the top plate and the connectors supported by the middle spring layer such that the first and second cantilevers and the first and second cavities enable a vertical displacement of the connectors and the top plate, which transports the top plate substantially vertically relative to the substrate and the standing feature during a change in the transducing space.

60. The micro-electro-mechanical transducer of claim 59 wherein the substrate is conductive and the transducing member includes at least a part of the conductive substrate as the first electrode.

61. The micro-electro-mechanical transducer of claim 59 wherein the top plate is significantly more rigid than the middle spring layer and is substantially unbent when transported by the vertical displacement of the connectors.

62. A micro-electro-mechanical transducer which is a capacitance micromachined ultrasonic transducer having a movable mechanical part to transform energy, the transducer comprising:
    a substrate;
    a middle spring layer placed over the substrate, the substrate and the middle spring layer defining a first cavity and a second cavity therebetween, the first cavity and the second cavity sharing a standing feature including a first sidewall bordering the first cavity and an opposing second sidewall bordering the second cavity, wherein the middle spring layer has a first portion connected to the first sidewall and covering at least a part of the first cavity, and a second portion connected to the second sidewall and covering at least a part of the second cavity;

a first connector having a connector height on the first portion of the middle spring layer, the first connector being horizontally distanced from the first sidewall by a sufficient length such that the first portion of the middle spring layer between the first connector and the first sidewall defines a first cantilever anchored at the first sidewall;

a second connector having substantially the same connector height on the second portion of the middle spring layer, the second connector being horizontally distanced from the second sidewall by a sufficient length such that the second portion of the middle spring layer between the second connector and the second sidewall defines a second cantilever anchored at the second sidewall; and a top plate placed over the first connector and the second connector, the connectors separating the top plate from the middle spring layer to define a transducing space below the top plate, wherein the first cantilever and the first cavity enable a vertical displacement of the first connector, and the second cantilever and the second cavity enable a vertical displacement of the second connector, the vertical displacements of the connectors transporting the top plate substantially vertically, thus changing the transducing space and activating a transducing member in the transducer for energy transformation, and wherein the transducing member comprises a top electrode and the bottom electrode, the standing feature of the substrate being conductive and the bottom electrode including at least a part of the standing feature of the substrate.

* * * * *